United States Patent
Ryu et al.

(10) Patent No.: US 7,710,035 B2
(45) Date of Patent: May 4, 2010

(54) PLASMA DISPLAY APPARATUS OMITTING AN EXHAUST UNIT

(75) Inventors: Seonghwan Ryu, Gumi-si (KR); Gyungrae Kim, Daegu (KR); Kirack Park, Gyeongsangbuk-do (KR); Jongwoon Bae, Gumi-si (KR)

(73) Assignee: LG Electronics Inc., Seoul (KR)

( * ) Notice: Subject to any disclaimer, the term of this patent is extended or adjusted under 35 U.S.C. 154(b) by 483 days.

(21) Appl. No.: 11/645,768

(22) Filed: Dec. 27, 2006

(65) Prior Publication Data
US 2008/0036378 A1     Feb. 14, 2008

(30) Foreign Application Priority Data
Aug. 10, 2006   (KR)   ...................... 10-2006-0075913

(51) Int. Cl.
    H01J 17/49   (2006.01)
(52) U.S. Cl. .................... 313/582; 313/112; 445/23
(58) Field of Classification Search ......... 313/582–587, 313/112; 454/23–25
    See application file for complete search history.

(56) References Cited

U.S. PATENT DOCUMENTS

| 2004/0095068 A1 * | 5/2004 | Hirota et al. ................ 313/582 |
| 2005/0181234 A1 | 8/2005 | Iida et al. |
| 2005/0189877 A1 * | 9/2005 | Ishida ......................... 313/512 |
| 2005/0212424 A1 * | 9/2005 | Kwon et al. ................. 313/582 |
| 2005/0264161 A1 * | 12/2005 | Oaku et al. .................. 313/486 |
| 2006/0250064 A1 * | 11/2006 | Park et al. ................... 313/112 |

FOREIGN PATENT DOCUMENTS

| CN | 1179393 | 9/2000 |
| CN | 1312536 | 9/2001 |
| CN | 1476384 | 2/2004 |
| CN | 1577697 | 2/2005 |
| EP | 1 677 336 A2 | 7/2006 |
| EP | 1 585 160 | 1/2009 |
| KR | 10-2002-0078040 A | 10/2002 |
| KR | 100579713 | 5/2006 |
| KR | 10-2006-0082527 A | 7/2006 |

OTHER PUBLICATIONS

European Search Report dated Jul. 2, 2009.

* cited by examiner

*Primary Examiner*—Joseph L Williams
(74) *Attorney, Agent, or Firm*—Ked & Associates LLP

(57) ABSTRACT

A plasma display apparatus is disclosed. The plasma display apparatus includes a plasma display panel and a filter positioned in front of the plasma display panel. The filter includes a near infrared ray shielding layer that absorbs or reflects near infrared rays. The plasma display panel includes a front substrate, a rear substrate, and a barrier rib, formed between the front and rear substrates, partitioning a discharge cell. An exhaust unit is omitted in the rear substrate. The discharge cell is filled with a discharge gas containing xenon (Xe) equal to or more than 10% based on total weight of the discharge gas.

20 Claims, 21 Drawing Sheets

| Lower width t1 of pattern portion | Upper width t2/2 of pattern portion | Aperture ratio | External light block |
|---|---|---|---|
| 23.0 μm | 23.0 μm | 50 % | ○ |
| 23.0 μm | 22.0 μm | 55 % | ○ |
| 23.0 μm | 20.0 μm | 60 % | ○ |
| 23.0 μm | 18.0 μm | 65 % | ○ |
| 23.0 μm | 16.0 μm | 70 % | ○ |
| 23.0 μm | 14.0 μm | 72 % | ○ |
| 23.0 μm | 12.0 μm | 75 % | ○ |
| 23.0 μm | 9.0 μm | 78 % | ○ |
| 23.0 μm | 8.0 μm | 80 % | ○ |
| 23.0 μm | 7.0 μm | 83 % | △ |
| 23.0 μm | 6.0 μm | 85 % | △ |
| 23.0 μm | 5.0 μm | 90 % | × |

FIG. 11c

| Lower width t1 of pattern portion / width of electrode | Moire fringe | External light block |
|---|---|---|
| 0.10 | △ | × |
| 0.15 | △ | × |
| 0.20 | × | △ |
| 0.25 | × | ○ |
| 0.30 | × | ○ |
| 0.35 | × | ○ |
| 0.40 | × | ○ |
| 0.45 | △ | ○ |
| 0.50 | △ | ○ |
| 0.55 | ○ | ○ |
| 0.60 | ○ | ○ |

FIG. 11d

| Height t3 of base portion | Height t2 of pattern portion | Dielectric breakdown | External light block |
|---|---|---|---|
| 120 μm | 120 μm | ○ | ○ |
| 120 μm | 115 μm | △ | ○ |
| 120 μm | 110 μm | × | ○ |
| 120 μm | 105 μm | × | ○ |
| 120 μm | 100 μm | × | ○ |
| 120 μm | 95 μm | × | ○ |
| 120 μm | 90 μm | × | ○ |
| 120 μm | 85 μm | × | ○ |
| 120 μm | 80 μm | × | ○ |
| 120 μm | 75 μm | × | △ |
| 120 μm | 70 μm | × | △ |
| 120 μm | 65 μm | × | △ |
| 120 μm | 60 μm | × | △ |
| 120 μm | 55 μm | × | △ |
| 120 μm | 50 μm | × | × |

FIG. 11e

| Lower width t1 of pattern portion / upper width of second barrier rib | Moire fringe | External light block |
|---|---|---|
| 0.10 | ○ | × |
| 0.15 | △ | × |
| 0.20 | △ | × |
| 0.25 | △ | × |
| 0.30 | × | △ |
| 0.35 | × | △ |
| 0.40 | × | ○ |
| 0.45 | × | ○ |
| 0.50 | × | ○ |
| 0.55 | × | ○ |
| 0.60 | × | ○ |
| 0.65 | × | ○ |
| 0.70 | △ | ○ |
| 0.75 | △ | ○ |
| 0.80 | △ | ○ |
| 0.85 | ○ | ○ |
| 0.90 | ○ | ○ |

: Reset period & address period     : Sustain period

PLASMA DISPLAY APPARATUS OMITTING AN EXHAUST UNIT

This Nonprovisional application claims priority under 35 U.S.C. §119(a) on patent application No. 10-2006-0075913 filed in Korea on Aug. 10, 2006 the entire contents of which are hereby incorporated by reference.

BACKGROUND

1. Field

This document relates to a plasma display apparatus.

2. Description of the Related Art

A plasma display apparatus includes a plasma display panel, on which an image is displayed using a plasma discharge, and a filter positioned in front of the plasma display panel.

A plasma display panel includes a phosphor layer inside discharge cells partitioned by barrier ribs and a plurality of electrodes.

A driving signal is supplied to the discharge cells through the electrodes, thereby generating a discharge inside the discharge cells.

When the driving signal generates the discharge inside the discharge cells, a discharge gas filled in the discharge cells generates vacuum ultraviolet rays, which thereby cause phosphors formed inside the discharge cells to emit light, thus displaying an image on the screen of the plasma display panel.

SUMMARY

In one aspect, a plasma display apparatus comprises a plasma display panel, on which an image is displayed, and a filter, positioned in front of the plasma display panel, including a near infrared ray shielding layer that absorbs or reflects near infrared rays, wherein the plasma display panel includes a front substrate on which a first electrode and a second electrode are formed in parallel to each other, a rear substrate on which a third electrode is formed to intersect the first electrode and the second electrode, wherein an exhaust unit is omitted in the rear substrate, and a barrier rib, formed between the front and rear substrates, partitioning a discharge cell, wherein the discharge cell is filled with a discharge gas containing xenon (Xe) equal to or more than 10% based on total weight of the discharge gas.

In another aspect, a plasma display apparatus comprises a plasma display panel, on which an image is displayed, and a filter, positioned in front of the plasma display panel, including a near infrared ray shielding layer that absorbs or reflects near infrared rays, wherein the plasma display panel includes a front substrate on which a first electrode and a second electrode are formed in parallel to each other, a rear substrate on which a third electrode is formed to intersect the first electrode and the second electrode, wherein an exhaust unit is omitted in the rear substrate, and a barrier rib, formed between the front and rear substrates, partitioning a discharge cell, wherein the discharge cell is filled with a discharge gas containing xenon (Xe) equal to or more than 10% based on total weight of the discharge gas, and wherein an adhesive layer for adhering the plasma display panel and the filter is formed between the plasma display panel and the filter, and the thickness of the adhesive layer ranges from 10 μm to 50 μm.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention.

FIG. 1 illustrates one example of a configuration of a plasma display apparatus according to one embodiment;

FIGS. 2*a* to 2*d* illustrate one example of a structure of a plasma display panel of the plasma display apparatus according to one embodiment;

FIG. 3 illustrates the plasma display apparatus according to one embodiment further including a buffer between the plasma display panel and a filter;

FIG. 4 illustrates one example of a method of manufacturing the plasma display panel according to one embodiment in which an exhaust unit is omitted;

FIGS. 5*a* and 5*b* are graphs illustrating a relationship between a content of xenon (Xe) and a magnitude of a driving voltage and a relationship between a content of xenon (Xe) and luminance;

FIGS. 6*a* and 6*b* illustrate a deposition of a filter;

FIG. 7 illustrates one example of a filter of the plasma display apparatus according to one embodiment;

FIG. 8 illustrates a near infrared ray shielding layer;

FIG. 9 illustrates an electromagnetic interference (EMI) shielding layer;

FIG. 10 illustrates an external light shielding layer;

FIGS. 11*a* to 11*e* illustrate a function of a pattern portion;

FIGS. 12*a* to 12*e* illustrate other forms of pattern portions;

FIGS. 13*a* and 13*b* illustrate a traveling direction of a pattern portion;

FIGS. 14*a* to 14*c* illustrate various types of pattern portions;

FIG. 15 illustrates one example of a case of using two or more pattern portions each having a different pattern;

FIG. 16 illustrates another structure of a pattern portion;

FIG. 17 illustrates a frame for achieving a gray level of an image displayed by the plasma display apparatus according to one embodiment;

FIG. 18 illustrates one example of an operation of the plasma display apparatus according to one embodiment;

FIGS. 19*a* and 19*b* illustrate another form of a rising signal and a second falling signal; and FIG. 20 illustrates another type of a sustain signal.

DETAILED DESCRIPTION OF PREFERRED EMBODIMENTS

Reference will now be made in detail embodiments of the invention examples of which are illustrated in the accompanying drawings.

FIG. 1 illustrates one example of a configuration of a plasma display apparatus according to one embodiment.

Referring to FIG. 1, the plasma display apparatus according to one embodiment includes a plasma display panel 100, on which an image is displayed, and a filter 110 positioned in front of the plasma display panel 100.

The filter 110 includes a near infrared ray shielding layer, that blocks near infrared rays by absorbing or reflecting the near infrared rays generated when driving the plasma display panel 100. A reason why the filter 110 includes the near infrared ray shielding layer will be described in detail later.

The following is a detailed description of the plasma display panel 100, on which the image is displayed using a plasma discharge, with reference to FIGS. 2a to 2d.

FIGS. 2a to 2d illustrate one example of a structure of a plasma display panel of the plasma display apparatus according to one embodiment.

Referring to FIG. 2a, the plasma display panel of the plasma display apparatus according to one embodiment includes a front substrate 201 and a rear substrate 211 which are coalesced with each other. On the front substrate 201, a first electrode 202 and a second electrode 203 are formed in parallel to each other. On the rear substrate 211, a third electrode 213 is formed to intersect the first electrode 202 and the second electrode 203.

An exhaust unit is omitted in the rear substrate 211. The exhaust unit may be omitted in both the front substrate 201 and the rear substrate 211. The exhaust unit may be at least one of an exhaust hole, an exhaust tip, or an exhaust pipe. The exhaust unit will be described in detail later with reference to FIG. 3.

The first electrode 202 and the second electrode 203 generate a discharge inside discharge spaces (i.e., discharge cells), and maintain the discharges of the discharge cells.

An upper dielectric layer 204 for covering the first electrode 202 and the second electrode 203 is formed on an upper portion of the front substrate 201 on which the first electrode 202 and the second electrode 203 are formed.

The upper dielectric layer 204 limits discharge currents of the first electrode 202 and the second electrode 203, and provides insulation between the first electrode 202 and the second electrode 203.

A protective layer 205 is formed on an upper surface of the upper dielectric layer 204 to facilitate discharge conditions. The protective layer 205 may be formed by depositing a material such as magnesium oxide (MgO) on an upper portion of the upper dielectric layer 204.

A lower dielectric layer 215 for covering the third electrode 213 is formed on an upper portion of the rear substrate 211 on which the third electrode 213 is formed. The lower dielectric layer 215 provides insulation of the third electrode 213.

Barrier ribs 212 of a stripe type, a well type, a delta type, a honeycomb type, and the like, are formed on an upper portion of the lower dielectric layer 215 to partition the discharge spaces (i.e., discharge cells). A red (R) discharge cell, a green (G) discharge cell, and a blue (B) discharge cell, and the like, are formed between the front substrate 201 and the rear substrate 211.

In addition to the red (R), green (G), and blue (B) discharge cells, a white (W) discharge cell or a yellow (Y) discharge cell may be further formed between the front substrate 201 and the rear substrate 211.

Pitches of the red (R), green (G), and blue (B) discharge cells may be substantially equal to one another. However, the pitches of the red (R), green (G), and blue (B) discharge cells may be different from one another to control a white balance in the red (R), green (G), and blue (B) discharge cells.

In this case, the pitches of all of the red (R), green (G), and blue (B) discharge cells may be different from one another, or alternatively, the pitch of at least one of the red (R), green (G), and blue (B) discharge cells may be different from the pitches of the other discharge cells. For instance, as illustrated in FIG. 2b, a pitch (a) of the red (R) discharge cell is the smallest, and pitches (b and c) of the green (G) and blue (B) discharge cells are more than the pitch (a) of the red (R) discharge cell.

The pitch (b) of the green (G) discharge cell may be substantially equal to or different from the pitch (c) of the blue (B) discharge cell.

The plasma display panel according one embodiment may have various forms of barrier rib structures as well as a structure of the barrier rib 212 illustrated in FIG. 2a. For instance, the barrier rib 212 includes a first barrier rib 212b and a second barrier rib 212a. The barrier rib 212 may have a differential type barrier rib structure in which the height of the first barrier rib 212b and the height of the second barrier rib 212a are different from each other, a channel type barrier rib structure in which a channel usable as an exhaust path is formed on at least one of the first barrier rib 212b or the second barrier rib 212a, a hollow type barrier rib structure in which a hollow is formed on at least one of the first barrier rib 212b or the second barrier rib 212a, and the like.

In the differential type barrier rib structure, as illustrated in FIG. 2c, a height h1 of the first barrier rib 212b may be less than a height h2 of the second barrier rib 212a. Further, in the channel type barrier rib structure or the hollow type barrier rib structure, a channel or a hollow may be formed on the first barrier rib 212b.

While the plasma display panel according to one embodiment has been illustrated and described to have the red (R), green (G), and blue (B) discharge cells arranged on the same line, it is possible to arrange them in a different pattern. For instance, a delta type arrangement in which the red (R), green (G), and blue (B) discharge cells are arranged in a triangle shape may be applicable. Further, the discharge cells may have a variety of polygonal shapes such as pentagonal and hexagonal shapes as well as a rectangular shape.

Each of the discharge cells partitioned by the barrier ribs 212 is filled with a predetermined discharge gas. The discharge gas contains xenon (Xe) equal to or more than 10% 10% based on total weight of the discharge gas. The discharge gas may contain xenon (Xe) of 13-30% based on total weight of the discharge gas. The discharge gas will be described in detail later.

Phosphor layers 214 for emitting visible light for an image display when generating an address discharge are formed inside the discharge cells partitioned by the barrier ribs 212. For instance, red (R), green (G) and blue (B) phosphor layers may be formed inside the discharge cells.

A white (W) phosphor layer and/or a yellow (Y) phosphor layer may be further formed in addition to the red (R), green (G) and blue (B) phosphor layers.

The thicknesses (widths) of the phosphor layers 214 formed inside the red (R), green (G) and blue (B) discharge cells may be substantially equal to one another. Or, the thickness of the phosphor layer 214 in at least one of the red (R), green (G) and blue (B) discharge cells may be different from the thicknesses of the phosphor layers 214 in the other discharge cells. For instance, as illustrated in FIG. 2d, thicknesses t2 and t3 of phosphor layers 214b and 214a in the green (G) or blue (B) discharge cells is more than a thickness t1 of a phosphor layer 214c in the red (R) discharge cell. The thickness t2 of the phosphor layer 214b in the green (G) discharge cell may be substantially equal to or different from the thickness t3 of the phosphor layer 214a in the blue (B) discharge cell.

It should be noted that only one example of the plasma display panel according to one embodiment has been illustrated and described above, and the embodiment is not limited to the plasma display panel of the above-described structure. For instance, although the above description illustrates a case where the upper dielectric layer 204 and the lower dielectric layer 215 each are formed in the form of a single layer, at least one of the upper dielectric layer 204 and the lower dielectric layer 215 may be formed in the form of a plurality of layers.

A black layer (not illustrated) for absorbing external light may be further formed on the upper portion of the barrier rib 212 to prevent the reflection of the external light caused by the barrier rib 212.

Further, another black layer (not illustrated) may be further formed at a predetermined position on the front substrate 201 corresponding to the barrier rib 212.

The third electrode 213 formed on the rear substrate 211 may have a substantially constant width or thickness. Further, the width or thickness of the third electrode 213 inside the discharge cell may be different from the width or thickness of the third electrode 213 outside the discharge cell. For instance, the width or thickness of the third electrode 213 inside the discharge cell may be more than the width or thickness of the third electrode 213 outside the discharge cell.

In this way, the structure of the plasma display panel according to one embodiment may be changed in various ways.

Since the front substrate 210 described above includes a glass material, it is a great likelihood of a damage to the front substrate 210 by an external impact.

To prevent the damage, a buffer is further formed between the plasma display panel 100 and the filter. The following is a detailed description of the buffer, with reference to FIG. 3.

FIG. 3 illustrates the plasma display apparatus according to one embodiment further including a buffer between the plasma display panel and a filter.

Referring to FIG. 3, one or more buffers 120 and 130 are formed between the plasma display panel 100 and the filter 110. The buffers 120 and 130 may include a material such as resin or glass.

The buffers 120 and 130 absorb an impact applied to the plasma display panel 100 from the outside, thereby protecting the plasma display panel 100. To more efficiently protect the plasma display panel 100, at least one of thicknesses t1 and t2 of the buffers 120 and 130 may range from 200 μm to 400 μm.

The buffers 120 and 130 may include an impact resistance film. For example, the buffer 120 may include an impact resistance film, and the buffer 130 may include a resin material.

While the number of buffers is two in FIG. 3, one, three or four buffers may be formed. The number of buffers may be controlled variously.

FIG. 4 illustrates one example of a method of manufacturing the plasma display panel according to one embodiment in which an exhaust unit is omitted.

Referring to FIG. 4, a reference numeral 300 indicates a chamber in which the front substrate 201 and the rear substrate 211 are positioned. A reference numeral 310a indicates an exhaust portion for exhausting a gas filled in the chamber 300 to the outside. A reference numeral 310b indicates a gas injection unit for injecting a discharge gas into the chamber 300. A reference numeral 350 indicates a firing unit for firing a seal layer 340.

First, the front substrate 201 and the rear substrate 211 formed through predetermined processes are positioned inside the chamber 300.

The seal layer 340 for coalescing the front substrate 201 and the rear substrate 211 may be formed on a portion of at least one of the front substrate 201 or the rear substrate 211. For example, as illustrated in FIG. 4, the seal layer 340 may be formed on the rear substrate 211.

The exhaust portion 310a exhausts a gas filled in the chamber 300. In other words, the exhaust portion 310a exhausts an impure gas inside the chamber 300 to the outside.

Next, the gas injection unit 310b injects a discharge gas into the chamber 300. More specifically, the gas injection unit 310b injects a discharge gas such as xenon (Xe), neon (Ne), argon (Ar) into the chamber 300 so that a pressure of the chamber 300 ranges from about $4 \times 10^{-2}$ torr to about 2 torr in an atmosphere of a temperature of about 200-400° C.

The front substrate 201 and the rear substrate 211 are coalesced using a predetermined coalescing device (not illustrated). At this time, the firing unit 350 applies heat or light to the seal layer 340 such that the seal layer 340 is hardened and fired. As a result, the front substrate 201 and the rear substrate 211 are coalesced sufficiently strongly.

The seal layer 340 may include a photo-crosslinked material. The firing unit 350 applies light to the seal layer 340 when coalescing the front substrate 201 and the rear substrate 211, thereby curing and firing the seal layer 340. Thus, the above processes prevent the generation of an impure gas when firing the seal layer 340.

As above, the plasma display panel is completed through the coalescing process of the front substrate 201 and the rear substrate 211. In other words, since the process for coalescing the front and rear substrates 201 and 211 and the process for injecting the discharge gas into the discharge cell are performed simultaneously, the front substrate 201 and the rear substrate 211 do not need to have an exhaust unit (for example, an exhaust hole). In other words, the exhaust hole may be omitted in the front substrate 201 and the rear substrate 211.

As above, since the exhaust hole is omitted, an exhaust tip for connecting the gas injection unit for injecting the discharge gas through the exhaust hole to the front and rear substrates 201 and 211 may be omitted. The exhaust tip may be interpreted as an exhaust pipe.

In a case where the exhaust of an impure gas inside a plasma display panel and the injection of a discharge gas are performed using an exhaust unit (for example, an exhaust hole) in the related art, the exhaust hole is positioned at a specific position of the plasma display panel. Further, since after coalescing front and rear substrates, the exhaust of the impure gas and the gas injection are performed, there is a great likelihood that the impure gas remains inside the plasma display panel (i.e., inside discharge cells). Thus, in the structure of the related art plasma display panel including the exhaust hole, the impure gas interferes with a discharge of the plasma display panel such that a firing voltage further increases and the discharge is unstably performed due to the deviation of the exhaust. As a result, the driving efficiency decreases.

On the other hand, as illustrated in FIG. 4, when the coalescence process of the front and rear substrates 201 and 211 and the injection process of the discharge gas are performed simultaneously, the impure gas is removed sufficiently and the discharge gas is injected sufficiently uniformly.

As compared the plasma display panel of FIG. 4 (i.e., the plasma display panel having a tip-less or hole-less structure), in which the exhaust hole is omitted, with the related art plasma display panel including the exhaust hole, the plasma display panel of FIG. 4 generates a sufficiently stable discharge at a relatively low firing voltage (i.e., a driving voltage).

A method of manufacturing the related art plasma display panel including the exhaust hole has to include a formation process of the exhaust hole, a coalescence process, a coupling process of an exhaust tip, an exhaust process, a gas injection process, and the like.

On the other hand, in the plasma display panel having the tip-less or hole-less structure, since the exhaust process and the gas injection process when performing the coalescence process are performed simultaneously, the number of manufacturing processes in the plasma display panel and manufacturing time are reduced. Thus, the manufacturing cost is reduced.

A noise generated inside the related art plasma display panel including the exhaust unit is emitted to the outside through the exhaust hole or the exhaust tip. Therefore, the whole noise of the related art plasma display panel increases.

On the other hand, a noise generated inside the tip-less or hole-less plasma display panel according one embodiment is not emitted to the outside because there is no path for emitting the noise to the outside. Therefore, the whole noise of the tip-less or hole-less plasma display panel is less than the whole noise of the related art plasma display panel.

The discharge gas is uniformly injected into the tip-less or hole-less plasma display panel such that the firing voltage is relatively low. Therefore, a content of Xe based on total weight of the discharge gas increases. The following is a detailed description of a Xe content.

Xe has a characteristic capable of increasing the generation of vacuum ultraviolet rays in the generation of a discharge. Therefore, when the content of Xe based on total weight of the discharge gas filled in the discharge cell increases, the quantity of light generated in the discharge cell increases such that luminance of an image increases.

However, Xe increases the firing voltage. For example, when the Xe content is equal to 2% based on total weight of the discharge gas, the firing voltage is equal to 150V and it is assumed that the quantity of light generated by one driving signal is quantitatively equal to 100.

When the Xe content is 10% based on total weight of the discharge gas, the firing voltage is equal to 250V and the quantity of light generated by one driving signal is quantitatively equal to 150.

In other words, as the Xe content increases, the quantity of light increases such that luminance increases. However, the firing voltage further increases.

On the other hand, the discharge gas is uniformly injected into the tip-less or hole-less plasma display panel such that the firing voltage is relatively low. Accordingly, although the Xe content relatively increases, an excessive increase in the firing voltage is prevented.

FIG. 5a is a graph illustrating changes in sustain driving voltages for generating a sustain discharge in each of a case A where there is an exhaust unit and a case B where there is no exhaust unit, when a Xe content changes within the range of 2-50% based on total weight of the discharge gas.

Figure 5A:
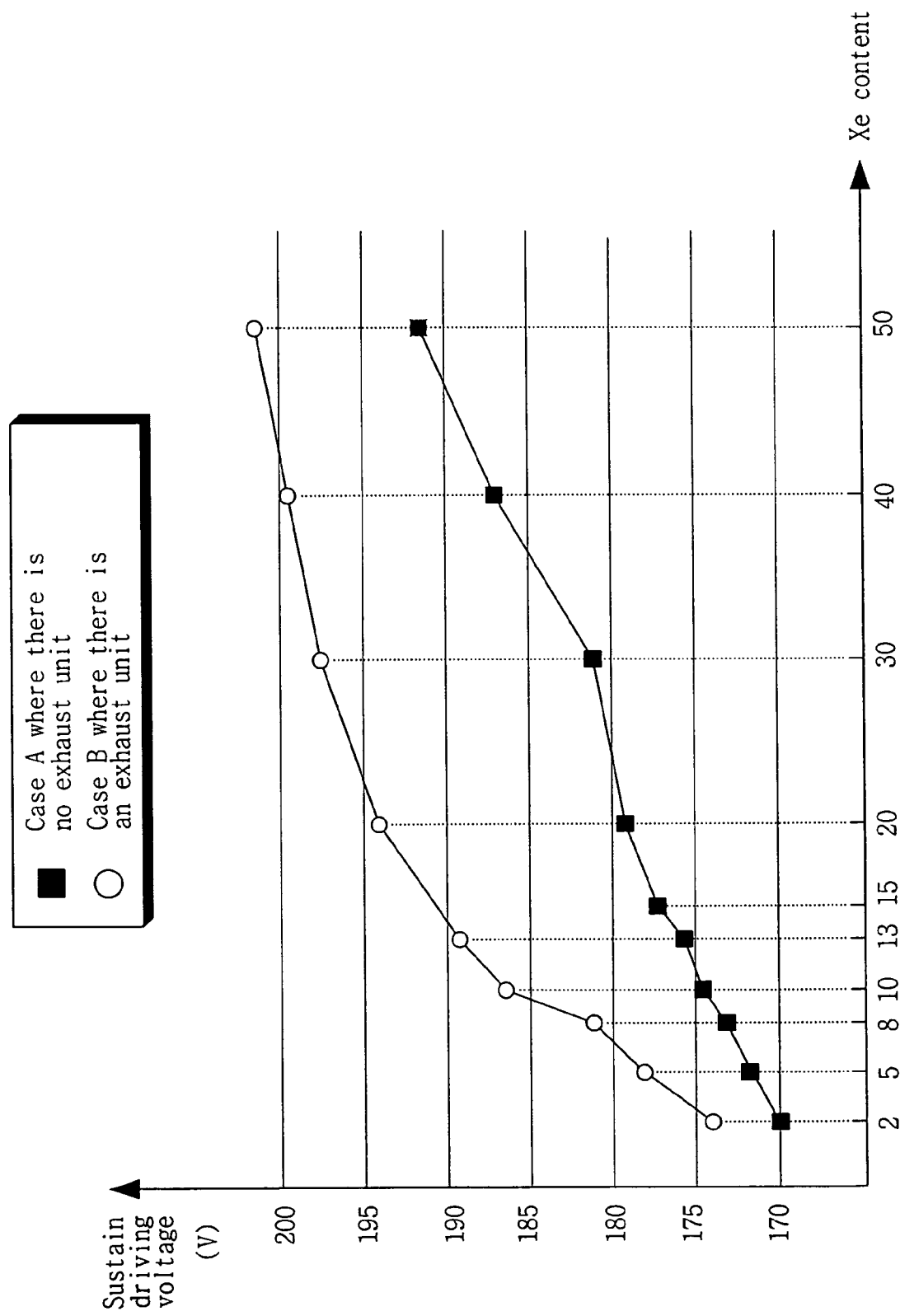
FIGS. 5a and 5b are graphs illustrating a relationship between a content of xenon (Xe) and a magnitude of a driving voltage and a relationship between a content of xenon (Xe) and luminance.

Referring to FIG. 5a, when the Xe content changes within the range of 2-10% based on total weight of the discharge gas, the sustain driving voltage in the case A changes within the range of about 174-187V. When the Xe content changes within the range of 10-50% based on total weight of the discharge gas, the sustain driving voltage in the case A changes within the range of about 187-203V. When the Xe content is equal to or more than 10%, the sustain driving voltage sharply increases in the case A according to the related art.

On the other hand, when the Xe content changes within the range of 2-10% based on total weight of the discharge gas, the sustain driving voltage in the case B changes within the range of about 170-174V. When the Xe content changes within the range of 10-30% based on total weight of the discharge gas, the sustain driving voltage in the case B changes within the range of about 174-181V. When the Xe content is equal to or more than 30%, the sustain driving voltage increases to about 181V or more in the case B according to one embodiment.

As above, the sustain driving voltage in the case B according to one embodiment is less than the sustain driving voltage in the case A according to the related art. Further, when the Xe content changes within the range of 10-30%, a difference between the sustain driving voltage in the case A the sustain driving voltage in the case B is relatively large.

Figure 5B:
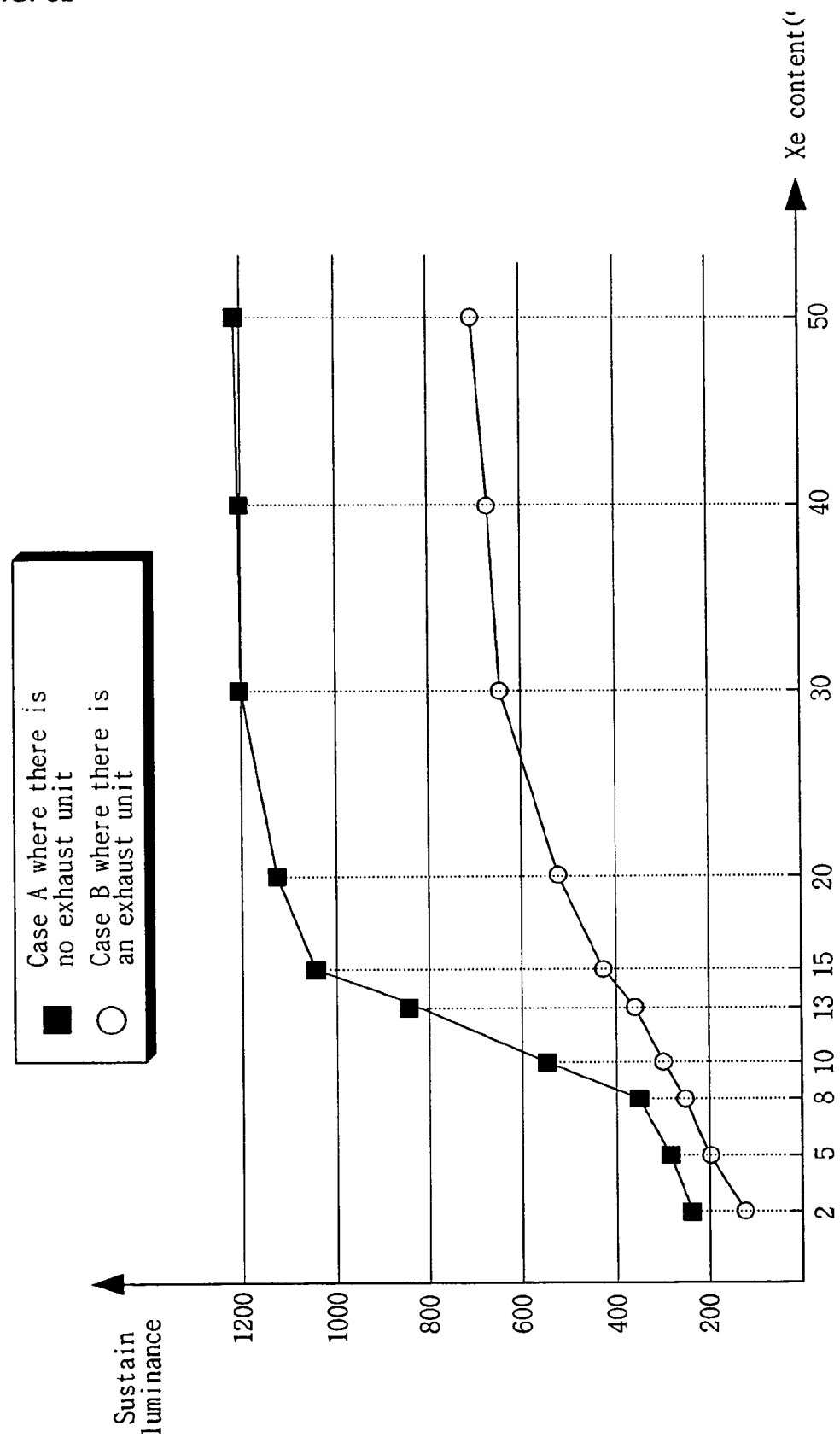

FIG. 5b is a graph illustrating changes in luminance levels (i.e., sustain luminance levels) of light generated by a sustain signal in each of a case A where there is an exhaust unit and a case B where there is no exhaust unit, when a Xe content changes within the range of 2-50% based on total weight of the discharge gas.

Referring to FIG. 5b, when the Xe content changes within the range of 2-10% based on total weight of the discharge gas, the sustain luminance level in the case A changes within the range of about 160-300. When the Xe content changes within the range of 10-50% based on total weight of the discharge gas, the sustain luminance level in the case A changes within the range of about 300-700.

On the other hand, when the Xe content changes within the range of 2-10% based on total weight of the discharge gas, the sustain luminance level in the case B changes within the range of about 240-560. When the Xe content changes within the range of 10-30% based on total weight of the discharge gas, the sustain luminance level in the case B changes within the range of about 560-1200. When the Xe content is equal to or more than 30%, the sustain luminance level in the case B is saturated at about 1200.

As above, the sustain luminance level in the case B according to one embodiment is more than the sustain luminance level in the case A according to the related art. Further, when the Xe content changes within the range of 10-30%, a difference between the sustain luminance level in the case A the sustain luminance level in the case B is relatively large.

As above, by setting the Xe content to be equal to or more than 10% or within the range of 13%-30% based on total weight of the discharge gas in the plasma display panel according to one embodiment, a sharp increase in the firing voltage is prevented and the luminance increases.

When the Xe content is set to be equal to or more than 10% or within the range of 13%-30% based on total weight of the discharge gas, the generation of near infrared rays increases due to a characteristic of Xe when driving the plasma display apparatus according to one embodiment. In other words, as the Xe content increases, the generation of the near infrared rays increases.

The near infrared rays cause a malfunction of a device such as a remote controller, thereby causing a malfunction of the plasma display panel.

Figure 1:
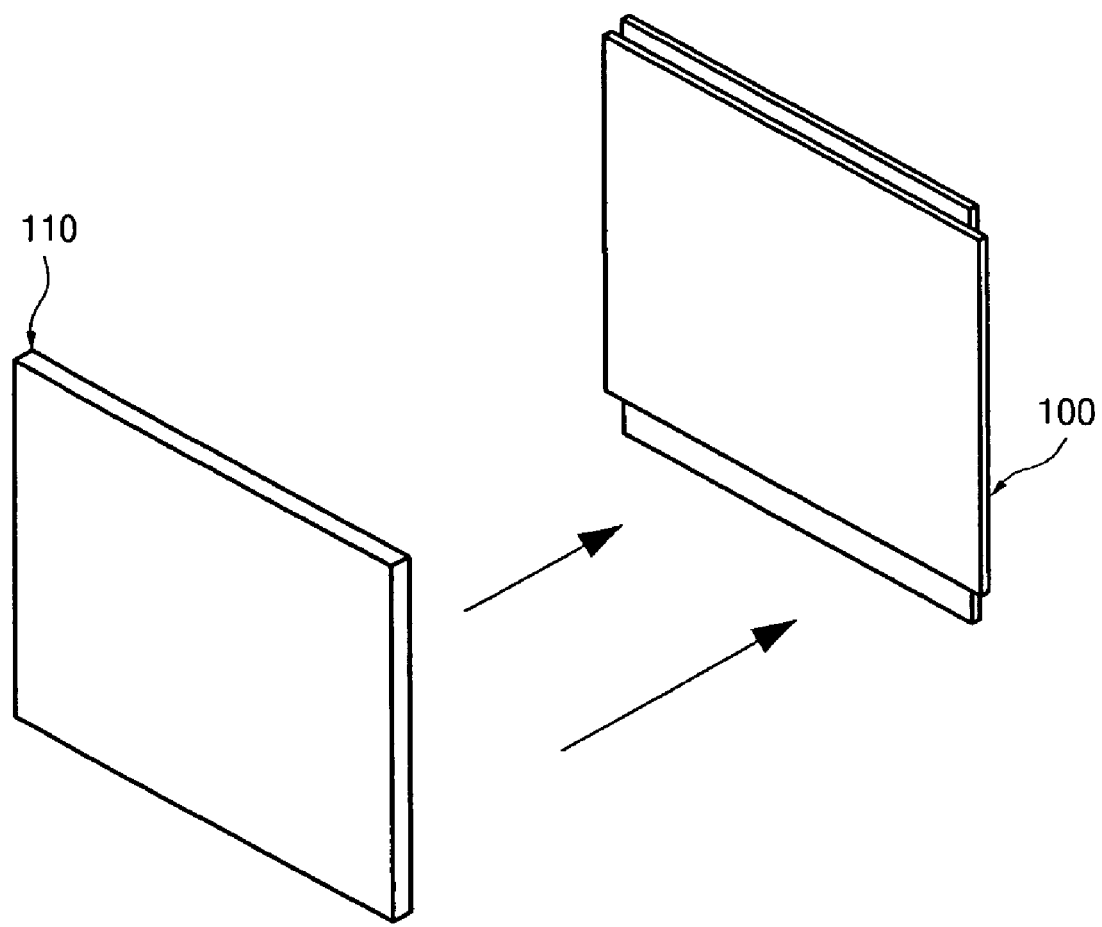

Accordingly, when the Xe content is equal to or more than 10% or within the range of 13%-30% based on total weight of the discharge gas, the filter may include the near infrared ray shielding layer as illustrated in FIG. 1. The near infrared ray shielding layer will be described in detail later, with reference to FIGS. 8a and 8b.

Figure 6A:
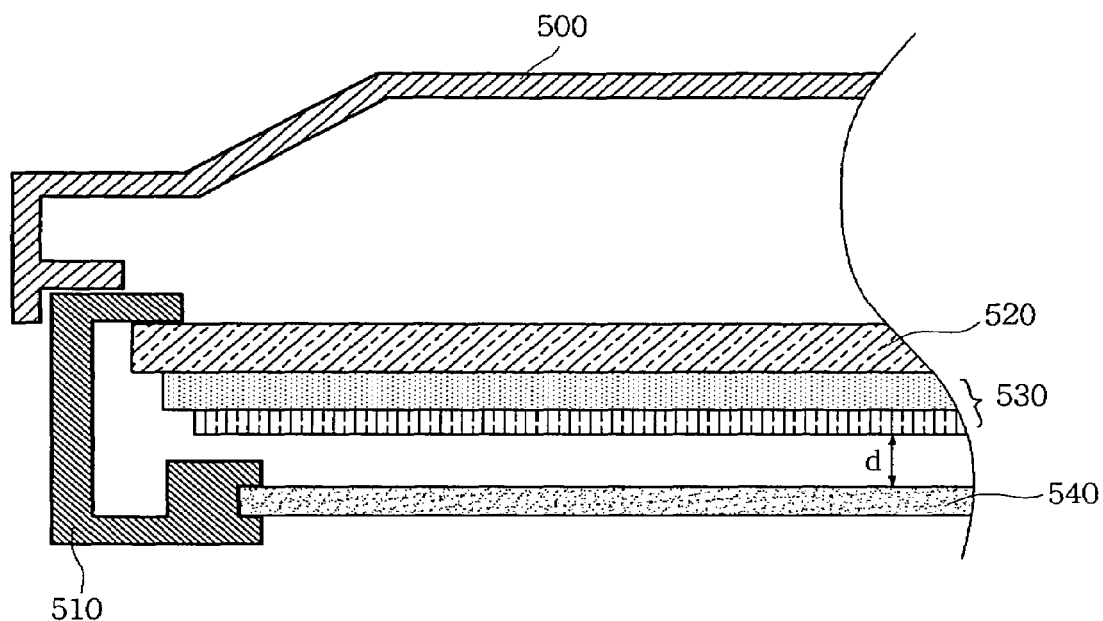
Figure 6B:
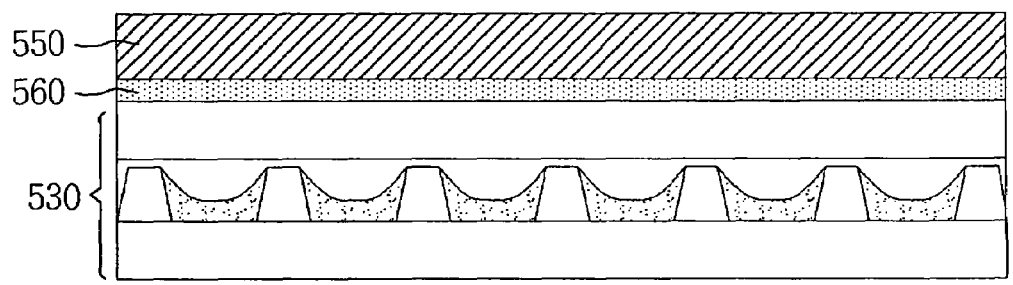

FIGS. 6a and 6b illustrate a deposition of a filter.

Referring to FIG. 6a, a filter 540 is spaced from a plasma display panel 530 by a predetermined distance d. A heat radiation frame 520 is positioned on a rear surface of the plasma display panel 530, and a front cover 510 is fastened to the heat radiation frame 520 by a fastening device (nit illustrated). The front cover 510 is connected to the filter 540 with the filter being spaced from the plasma display panel 530 by the predetermined distance d. A reference numeral 500 indicates a back cover.

The filter 540, spaced from the plasma display panel 530 by the predetermined distance d, may be a glass type filter in which a glass substrate is used as a base and a near infrared ray shielding layer is positioned on the glass substrate.

Referring to FIG. 6b, a filter 550 is adhered to a front surface of the plasma display panel 530 using a laminating method, and the like.

The laminating method is to adhere a sheet type filter to the front surface of the plasma display panel 530 using a roller, and the like.

For example, an adhesive layer 560 is formed on the front surface of the plasma display panel 530. The filter 550 is adhered to the front surface of the plasma display panel 530 using the adhesive layer 560.

The filter 550 adhered to the front surface of the plasma display panel 530 may be a glass type filter in which a resin material substrate using a resin material such as polymer resin is used as a base and a near infrared ray shielding layer is positioned on the resin material substrate.

The thickness of the adhesive layer 560 ranges from 10 μm to 50 μm or from 20 μm to 30 μm to prevent a reduction in transmissivity of light generated in the plasma display panel 530 and to sufficiently secure an adhesive strength between the plasma display panel 530 and the filter 550.

Figure 7:
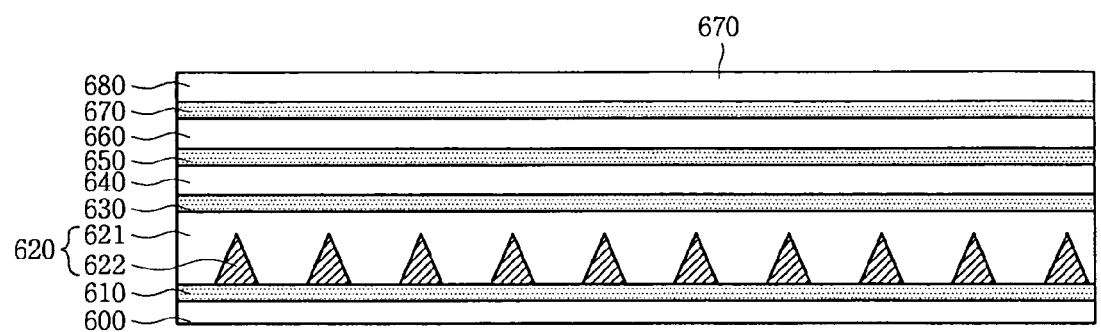

FIG. 7 illustrates one example of a filter of the plasma display apparatus according to one embodiment.

Referring to FIG. 7, a filter may include a plurality of functional layers which are stacked one another.

For example, an external light shielding layer 620 is formed on a base layer 600, a near infrared ray shielding layer 640 is formed on the external light shielding layer 620, an electromagnetic interference (EMI) shielding layer 660 is formed on the near infrared ray shielding layer 640, and a color layer 680 is formed on the EMI shielding layer 660. The external light shielding layer 620 includes a base portion 621 and a pattern portion 622. The base portion 621 and the pattern portion 622 will be described in detail later.

Adhesive layers 610, 630, 650 and 670 are formed between the functional layers 600, 620, 640, 660 and 680 to adhere the functional layers 600, 620, 640, 660 and 680 to each other.

It should be noted that FIG. 7 has illustrated and described one example of the filter of the plasma display apparatus according to one embodiment, and the present embodiment is not limited to the filter illustrated in FIG. 7. For example, the filter of the plasma display apparatus according to one embodiment may further include another functional layer such as an anti-glare layer or an anti-reflection layer.

Further, the plurality of functional layers may be stacked in a different order from the stack order of the plurality of functional layers illustrated in FIG. 7. For example, the base layer 600, the external light shielding layer 620, the color layer 680, the EMI shielding layer 660, and the near infrared ray shielding layer 640 may be stacked in the order named.

Further, at least one of the base layer 600, the external light shielding layer 620, the color layer 680, and the EMI shielding layer 660 except the near infrared ray shielding layer 640 may be omitted.

The base layer 600 functions as a base of the functional layers 620, 630, 660 and 680. The base layer 600 is strong to a temperature and a humidity. The base layer 600 may include a high strength material such as resin or glass.

The near infrared ray shielding layer 640 reflects or absorbs near infrared rays generated in the plasma display panel, and transmits visible light. For example, the near infrared ray shielding layer 640 transmits light having a wavelength of 400-700 nm, and reflects or absorbs light having a wavelength of 820-880 nm.

The near infrared ray shielding layer 640 may include resin containing dyes of an organic compound. For example, the near infrared ray shielding layer 640 may include resin containing dyes of an organic compound such as anthraquinone-based, phthalocyanine-based, or resin containing an organic compound of a metal complex.

The near infrared ray shielding layer 640 may include a plurality of layers that are stacked one another.

Figure 8:
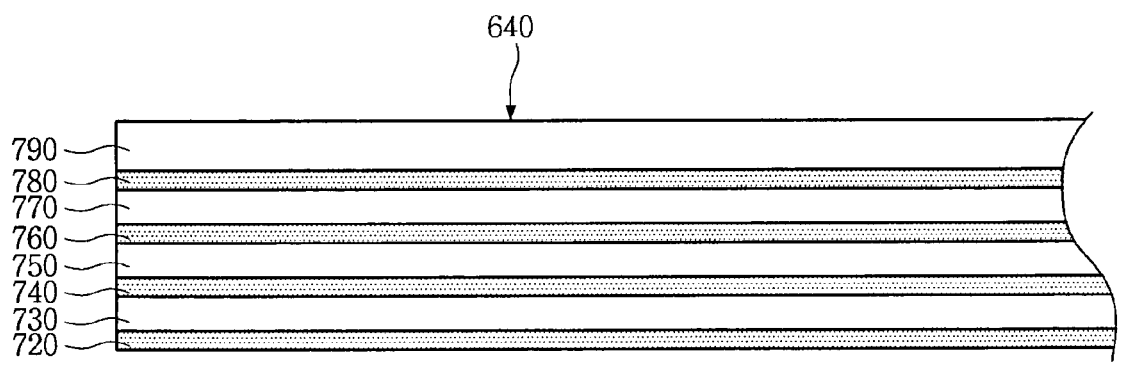

FIG. 8 illustrates a near infrared ray shielding layer.

Referring to FIG. 8, the near infrared ray shielding layer 640 includes a plurality of layers 720 to 790 having different refraction indexes that are stacked one another.

The layers 720, 740, 760 and 780 may have an equal refraction index, and the layers 730, 750, 770 and 790 may have an equal refraction index.

Further, the refraction indexes of the layers 720, 740, 760 and 780 may be different from the refraction indexes of the layers 730, 750, 770 and 790.

For example, the layers 720, 740, 760 and 780 may be a single layer. As a material of the single layer, $TiO_2$, $Ta_2O_5$ or $ZrO_2$ having a relatively high refraction index may be used. Further, the layers 720, 740, 760 and 780 may be a multi-layered layer. As a material of the multi-layered layer, $Pr_6O_{11}$ and $TiO_2$ having a relatively high refraction index may be used. The layers 730, 750, 770 and 790 may contain $MgF_2$ and $SiO_2$ having a relatively low refraction index.

The layers 720, 740, 760 and 780 may include Ag, and the layers 730, 750, 770 and 790 may include indium-tin-oxide (ITO).

As above, when the near infrared ray shielding layer 640 is formed by stacking the plurality of layers having the different refraction indexes, near infrared rays are reflected by a difference between the refraction indexes of the plurality of layers. Therefore, an emission of near infrared rays generated in the plasma display panel to the outside is prevented.

FIG. 8 has illustrated and described one example of the near infrared ray shielding layer, and thus the present embodiment is not limited to the near infrared ray shielding layer illustrated in FIG. 8. For example, while FIG. 8 illustrates the near infrared ray shielding layer including 8 layers, the near infrared ray shielding layer may include a total of 4, 5 and 6 layers.

Further, while FIG. 8 illustrates the near infrared ray shielding layer in which two layers each having a different refraction index are alternately stacked, three or four layers each having a different refraction index may be alternately stacked.

As above, the near infrared ray shielding layer 640 may have various structures.

As illustrated in FIG. 8, when the near infrared ray shielding layer 640 is formed by stacking the plurality of layers having the different refraction indexes, the near infrared ray shielding layer 640 may perform a function of the EMI shielding layer.

More specifically, since the plurality of layers having the different refraction indexes of the near infrared ray shielding layer include an electrically conductive metal, when the near infrared ray shielding layer is grounded, the near infrared ray shielding layer provides a movement path of charge particles being a factor causing an electromagnetic wave. Accordingly, EMI generated by driving the plasma display apparatus is reduced.

As above, in a case where the near infrared ray shielding layer is formed by stacking the plurality of layers having the different refraction indexes, the EMI shielding layer may be omitted.

Figure 9:
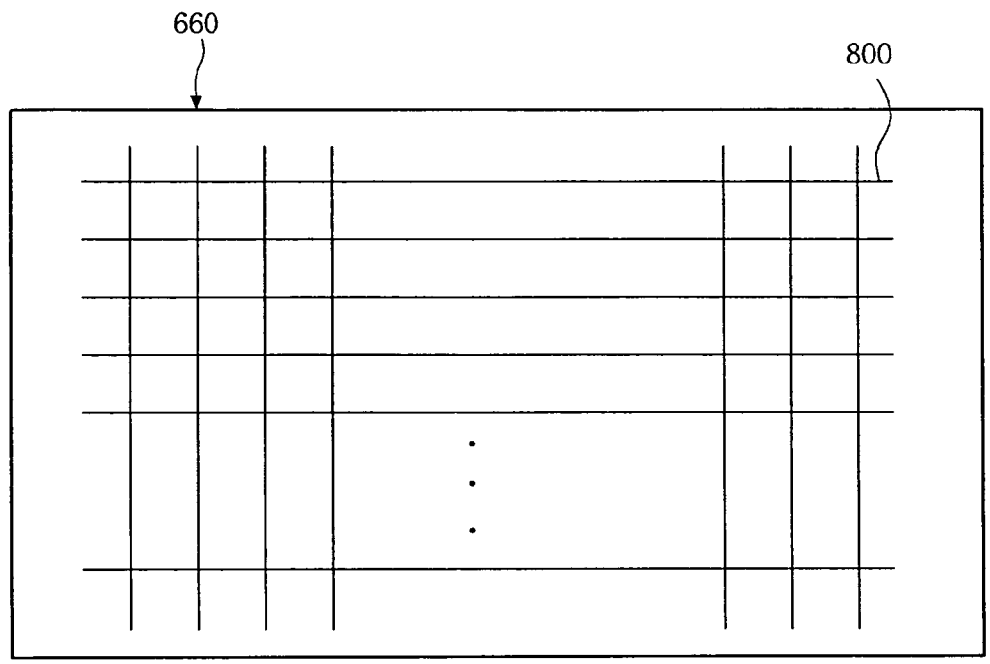

FIG. 9 illustrates an electromagnetic interference (EMI) shielding layer.

Referring to FIG. 9, the EMI shielding layer 660 may be a mesh type. In other words, electrodes 800 are formed in a mesh pattern.

As above, when the electrodes 800 are formed in the mesh pattern, EMI generated by driving the plasma display apparatus is sufficiently reduced.

The electrodes 800 may be grounded to efficiently emit charge particles causing EMI.

While FIG. 9 illustrates the mesh type EMI shielding layer, the EMI shielding layer may be formed in a sputter type. For example, the EMI shielding layer 660 may have a stack structure of a transparent electrode layer made of a transparent material such as ITO and a metal electrode layer made of a metal having excellent electrical conductivity such as Ag. The structure of the sputter type EMI shielding layer may be substantially the same as the structure of the EMI shielding layer illustrated in FIG. 7.

Figure 10:
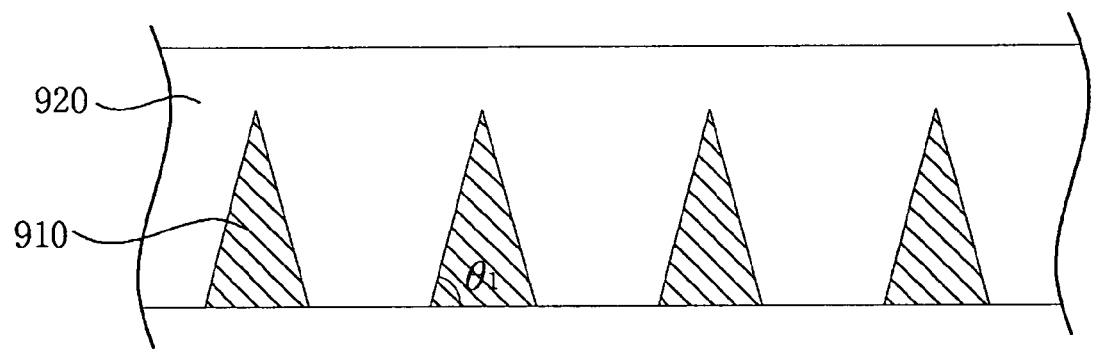

FIG. 10 illustrates an external light shielding layer.

Referring to FIG. 10, an external light shielding layer of the filter of the plasma display apparatus according to one embodiment includes a pattern portion 910 and a base portion 920.

The pattern portion 910 is formed on the base portion 920. The number of pattern portions 910 is plural, and the plurality of pattern portions 910 are positioned to be spaced with a predetermined distance therebetween. The pattern portion 910 includes a light absorption material. The light absorption material includes at least one of carbon, pigment, or dyes.

The base portion 920 provides a formation base to the pattern portion 910, and has a refraction index more than a refraction index of the pattern portion 910. The base portion 920 may include a transparent material.

A color of the pattern portion 910 may be darker than a color of the base portion 920. For example, the color of the pattern portion 910 may be black. As the pattern portion 910 goes toward the base portion 920, the width of the pattern portion 910 gradually decreases. For example, the section shape of the pattern portion 910 is approximately an isosceles triangle.

Accordingly, one surface of the base portion 920 parallel to the base of the pattern portion 910 and the pattern portion 910 form a predetermined angle θ1. The angle θ1 may be equal to or more than about 70° and less than about 90°.

FIGS. 11a to 11e illustrate a function of a pattern portion.

Figures 11A, 11B:
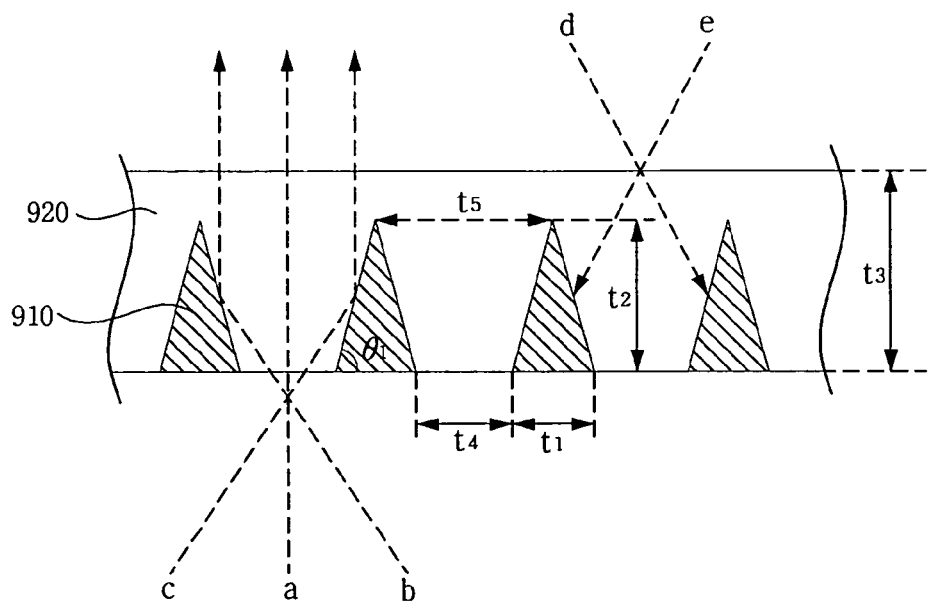

Referring to FIG. 11a, light generated at a point "a" positioned at the inside of the filter directly is emitted to the outside. Light generated at points "b" and "c" positioned at the inside of the filter is totally reflected by the pattern portion 910 and then emitted to the outside.

However, light entered from points "d" and "e" positioned at the outside of the filter is absorbed into the pattern portion 910. This occurs because the refractive index of the pattern portion 910 is less than the refractive index of the base portion 920 and one surface of the base portion 920 parallel to the base of the pattern portion 910 and the pattern portion 910 form the predetermined angle θ1.

As light generated at the inside of the filter is effectively emitted to the outside and light entered from the outside of the filter is absorbed, contrast of an image displayed on the plasma display panel is improved.

To more effectively absorb light entered from the outside of the filter and to more effectively emit light generated at the inside of the filter, the refractive index of the pattern portion 910 is 0.8 to 0.999 times the refractive index of the base portion 920.

An upper area of the pattern portion 910 is farther from the plasma display panel than a bottom area of the pattern portion 910. The width (hereinafter, referred to an upper width) of the pattern portion 910 in the upper area is less than the width (hereinafter, referred to a lower width t1) of the pattern portion 910 in the bottom area. The upper width and the lower width t1 of the pattern portion 910 are set to sufficiently secure the block efficiency of light entered from the outside of the filter and the reflection efficiency of light generated at the inside of the filter.

For example, as illustrated in FIG. 11b, when the lower width t1 of the pattern portion 910 is set to 23.0 μm and the upper width of the pattern portion 910 is equal to or less than 23.0 μm, an aperture ratio that is equal to or more than 50% is secured. When the upper width of the pattern portion 910 is equal to or less than 8.0 μm, the block efficiency of light entered from the outside of the filter is reduced. When the height of the pattern portion 910 is t2, the upper width of the pattern portion 910 corresponds to half (t2/2) the height t2 of the pattern portion 910.

When the lower width t1 of the pattern portion 910 range from 1 to 3.5 times the upper width, it is advantageous to block external light and to secure the aperture ratio.

Figure 2A:
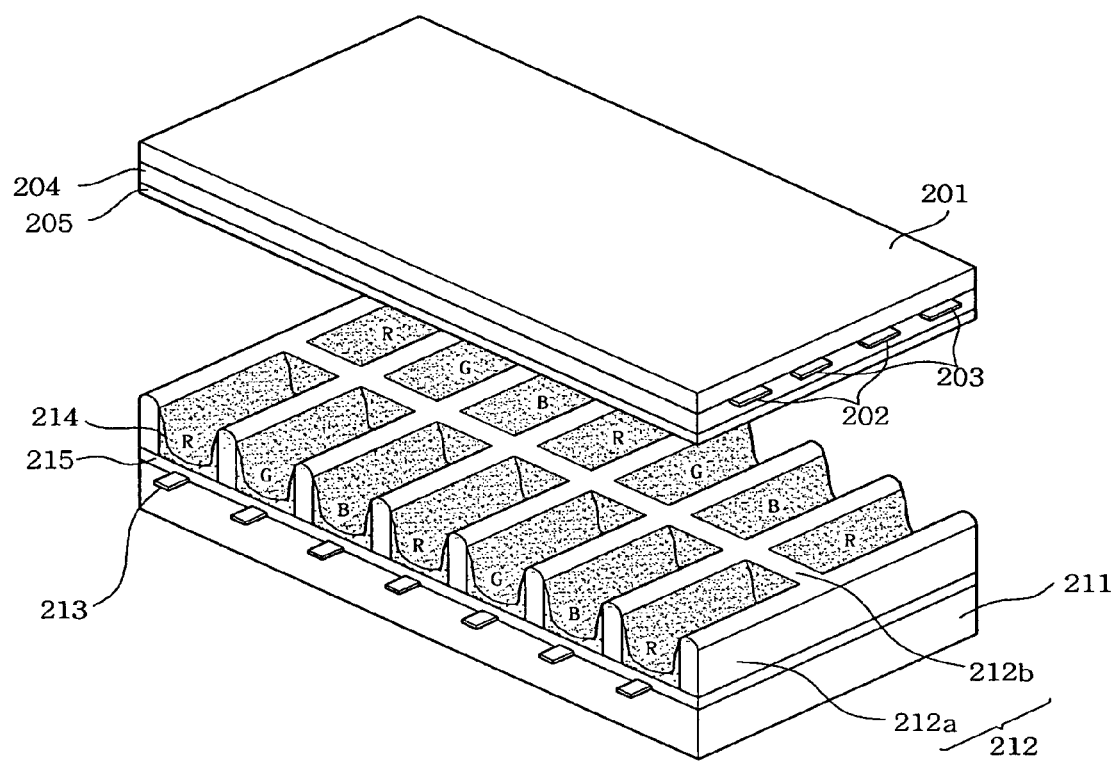
Figure 2B:
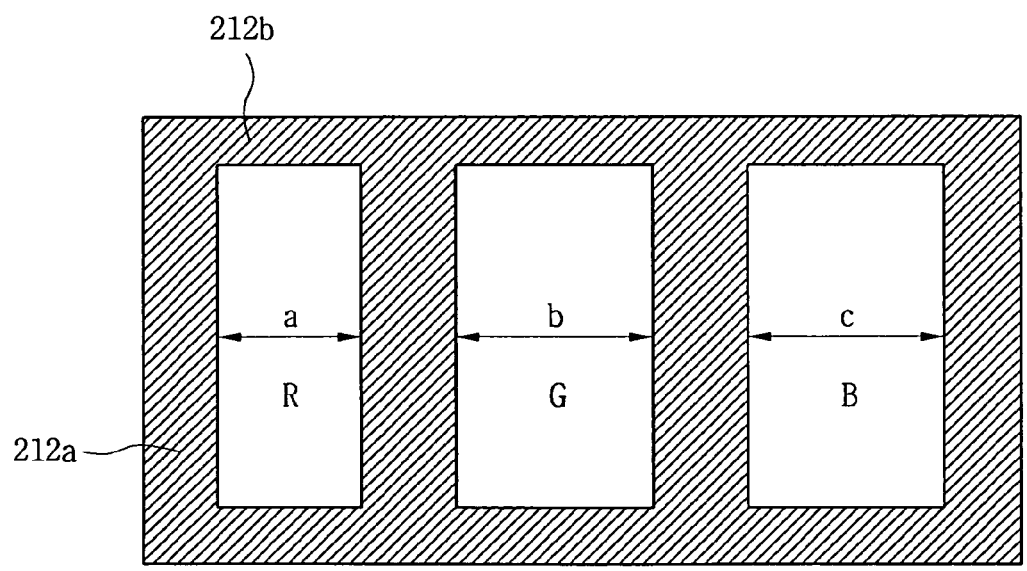
Figure 2C:
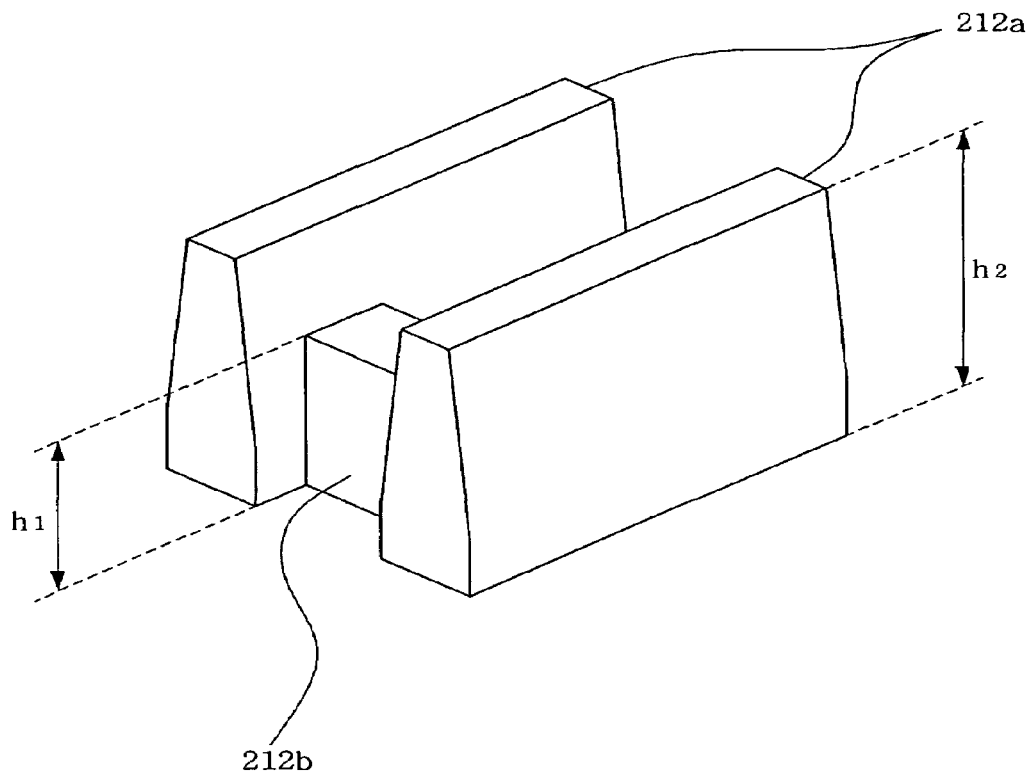
Figure 2D:
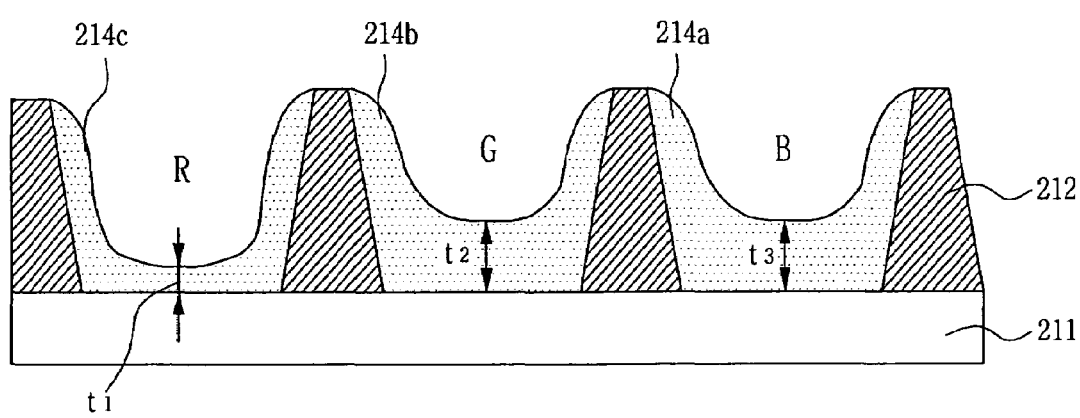
Figure 3:
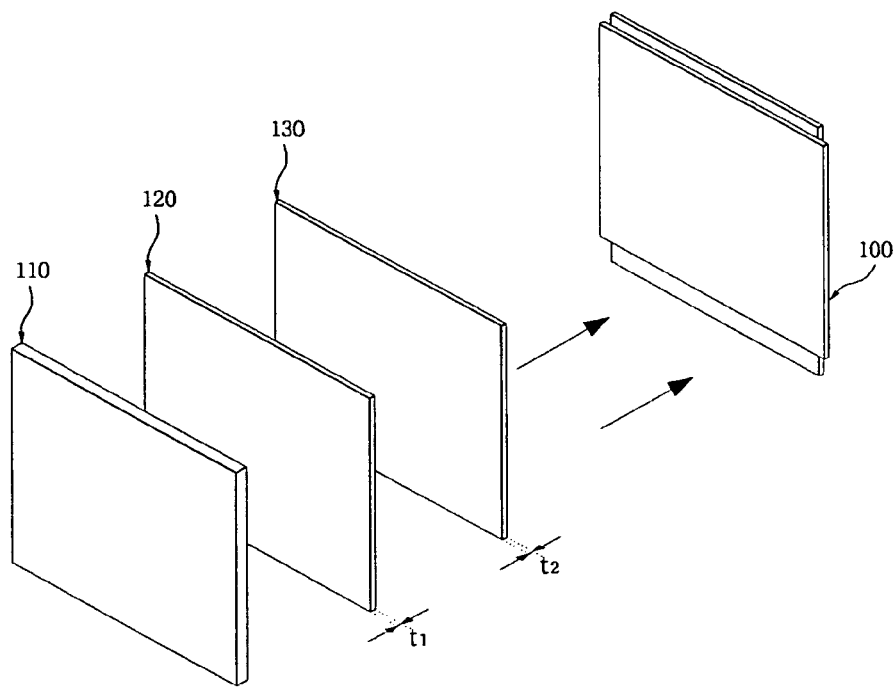
Figure 4:
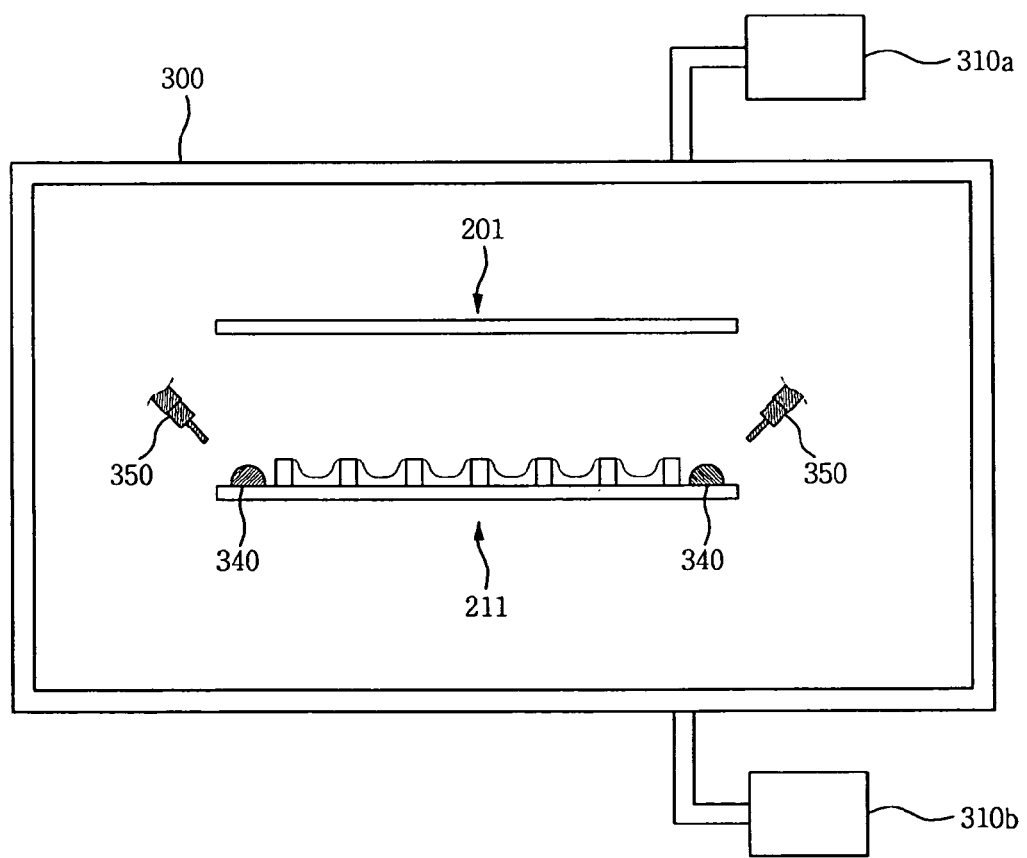

The lower width t1 of the pattern portion 910 may be less than the closest distance between the first electrode 202 and the second electrode 203 (refer to FIG. 2a). In this case, the block efficiency of light entered from the outside of the filter and the reflection efficiency of light generated at the inside of the filter increase.

The lower width t1 of the pattern portion 910 may depend on the width of each of the first electrode 202 and the second electrode 203. For example, as illustrated in FIG. 11c, when a ratio of the lower width t1 of the pattern portion 910 to the width of the first electrode 202 or the second electrode 203 ranges from 0.2 to 0.5, an interference fringe (i.e., Moire fringe) generated when two or more periodic patterns overlap is prevented and the external light is blocked efficiently.

In a case where the first electrode 202 and the second electrode 203 each include a transparent electrode and a bus electrode, a ratio of the lower width t1 of the pattern portion 910 to the width of the bus electrode of the first electrode 202 or the second electrode 203 may range from 0.2 to 0.5.

A ratio of a height t3 of the base portion 920 to the height t2 of the pattern portion 910 is set to block the external light and to prevent the dielectric breakdown.

For example, as illustrated in FIG. 11d, when the height t3 of the base portion 920 is set to 120 μm and the height t2 of the pattern portion 910 is equal to or more than 120 μm, the thickness of the base portion 920 decreases. As a result, it is a great likelihood of dielectric breakdown of the pattern portion 910 such that a defective proportion of a filter may increase. When the height t2 of the pattern portion 910 is equal to or less than 50 μm, light incident on the pattern portion 910 at a predetermined angle is not blocked such that the block efficiency of the external light decreases.

Accordingly, it is preferable that the height t3 of the base portion 920 ranges from 1.01 to 2.25 times the height t2 of the pattern portion 910.

A ratio of the lower width t1 of the pattern portion 910 to the width of the barrier rib is set to prevent Moire fringe and to sufficiently secure the block efficiency of the external light.

For example, as illustrated in FIG. 11e, when a ratio of the lower width t1 of the pattern portion 910 to the width of the second barrier rib 212a (refer to FIG. 2a) ranges from 0.3 to 0.8, the formation of Moire fringe is prevented and the external light is efficiently blocked.

Furthermore, the shortest gap t4 between the pattern portions 910 ranges from 1.1 to 5 times the lower width t1 of the pattern portion 910. Accordingly, an aperture ratio of the filter is sufficiently secured, light entered from the outside of the filter is sufficiently blocked, and manufacturing processes of the pattern portion 910 are easily performed.

Furthermore, the longest gap t5 between the pattern portions 910 ranges from 1.1 to 3.25 times the shortest t4 between the pattern portions 910. Accordingly, the aperture ratio of the filter is sufficiently secured, and the angle θ1 of the pattern portion 410 is set to an ideal value such that light entered from the outside of the filter is sufficiently blocked.

Furthermore, the height t2 of the pattern portion 910 ranges from 0.89 to 4.25 times the shortest t4 between the pattern portions 910. Accordingly, the aperture ratio of the filter is sufficiently secured, and light entered from the outside of the filter is sufficiently blocked.

For example, the lower width t1 of the pattern portion 910 ranges from 18 μm to 35 μm.

The height t2 of the pattern portion 910 ranges from 80 μm to 170 μm.

The height t3 of the base portion 920 ranges from 100 μm to 180 μm.

The shortest gap t4 between the pattern portions 910 ranges from 40 μm to 90 μm.

The longest gap t5 between the pattern portions 910 ranges from 90 μm to 130 μm.

FIGS. 12a to 12e illustrate other forms of pattern portions.

Figure 12A:
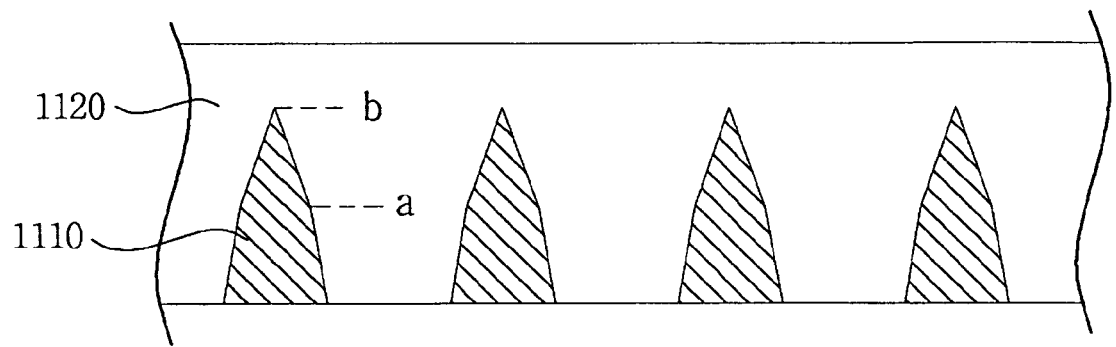

Referring to FIG. 12a, a pattern portion 1110 includes two portions each having a different width. For example, the pattern portion 1110 has a first width at a point "a", and has a second width at a point "b" above the point "a". In other words, the width of the pattern portion 1110 decreases with a first ratio up to the point "a", and decreases with a second ratio, that is more than the first ratio, from the point "a" to the point "b".

Figure 12B:
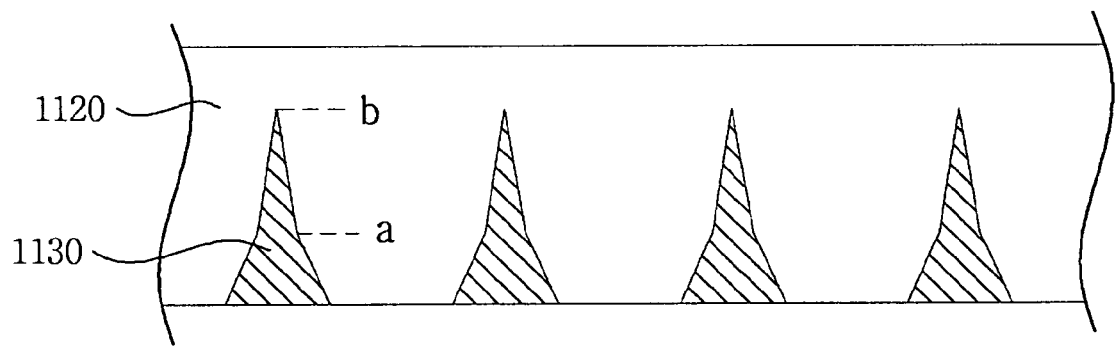

Referring to FIG. 12b, unlike FIG. 12a, the width of a pattern portion 1130 decreases with a first ratio up to a point "a", and decreases with a second ratio, that is less than the first ratio, from the point "a" to a point "b".

Figure 12C:
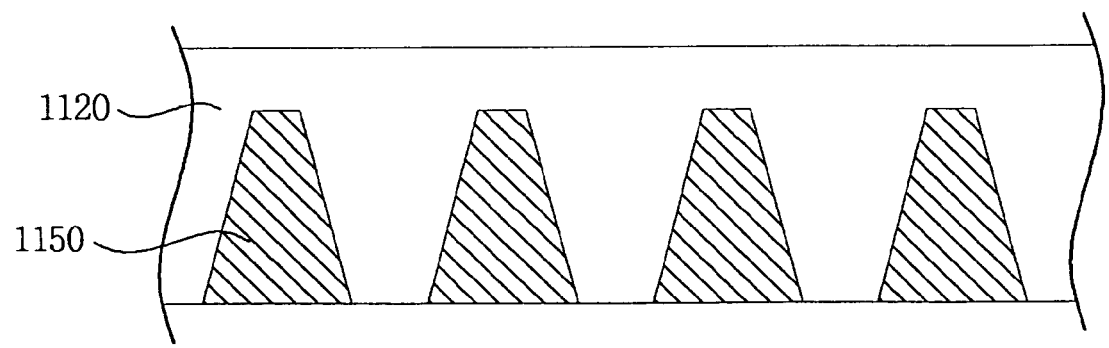

Referring to FIG. 12c, a tip of a pattern portion 1150 has a substantially flat form.

Figure 12D:
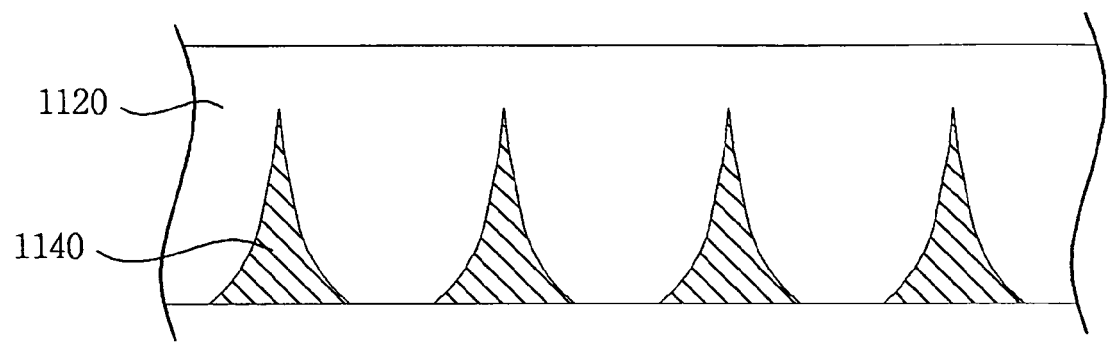

Referring to FIG. 12d, a side surface of the pattern portion 1140 forms a smooth curved line.

Figure 12E:
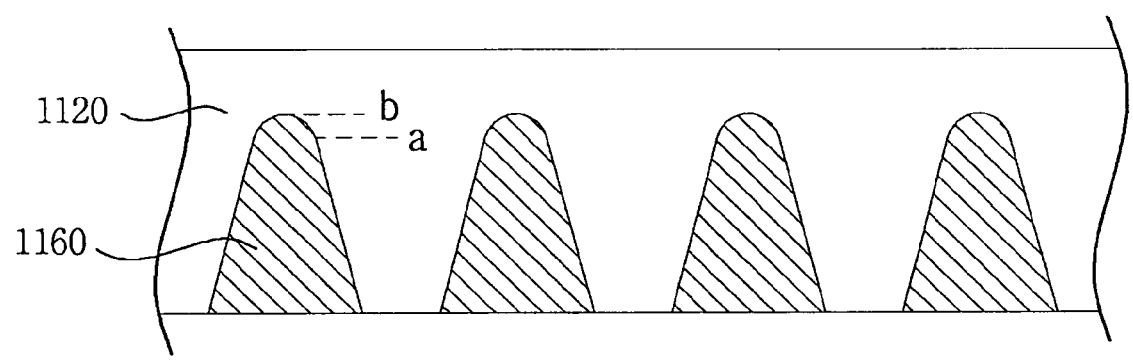

Referring to FIG. 12e, a side surface of the pattern portion 1160 is a substantially straight line form up to a point "a" and is a curved line form from the point "a" to a point "b".

As described above, a form of the pattern portion may be variously changed.

Figure 13A:
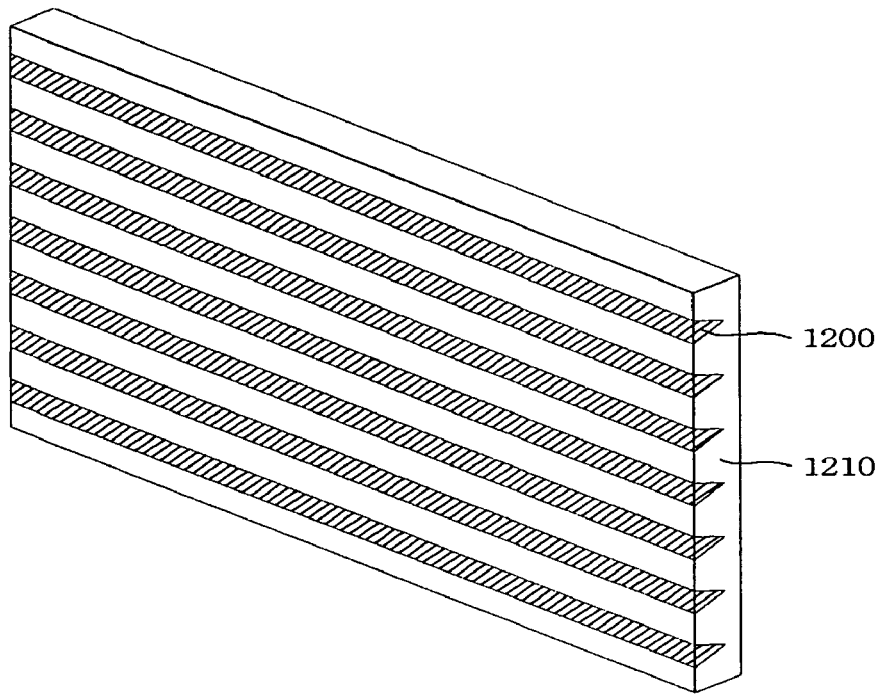
Figure 13B:
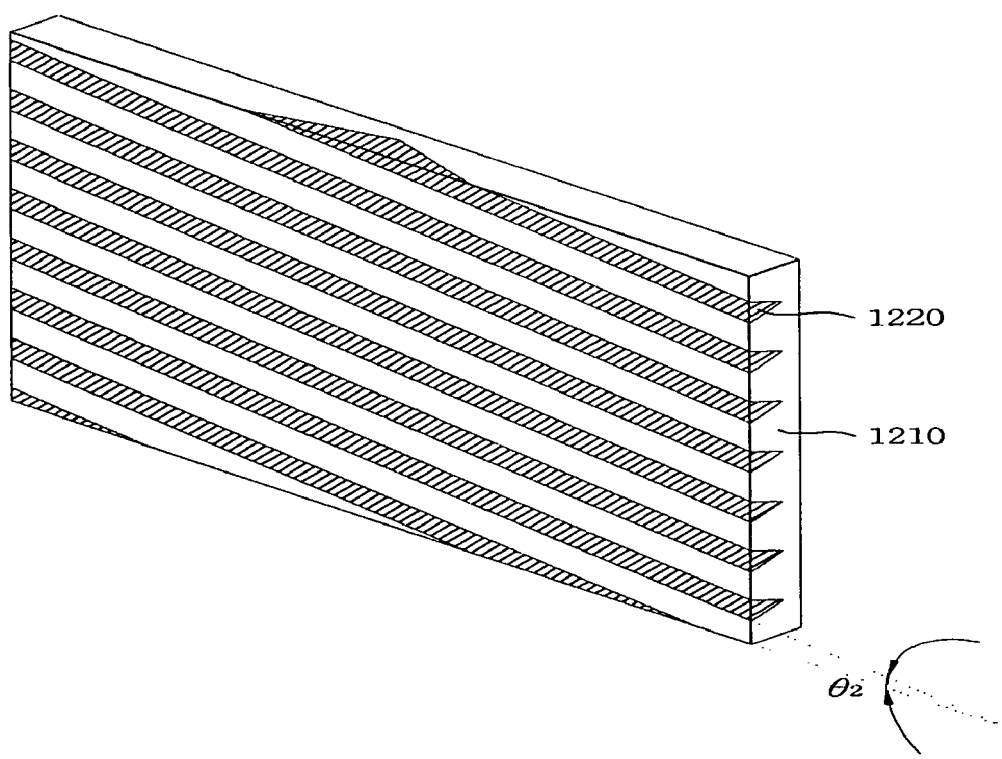

FIGS. 13a and 13b illustrate a traveling direction of a pattern portion.

Referring to FIG. 13a, a traveling direction of a pattern portion 1200 and a long side of a base portion 1210 are substantially parallel to each other.

Referring to FIG. 13b, a traveling direction of a pattern portion 1220 and a long side of the base portion 1210 form a predetermined angle θ2.

As above, when the traveling direction of the pattern portion 1220 and the long side of the base portion 1210 form the predetermined angle θ2, the generation of Moire fringe is efficiently prevented.

Furthermore, to more effectively prevent Moire fringe, the predetermined angle θ2 may range from 0.5° to 9° or from 0.5° to 4.5°.

While a stripe type of the pattern portion has been described above, a type of the pattern portion may be variously changed.

Figure 14A:
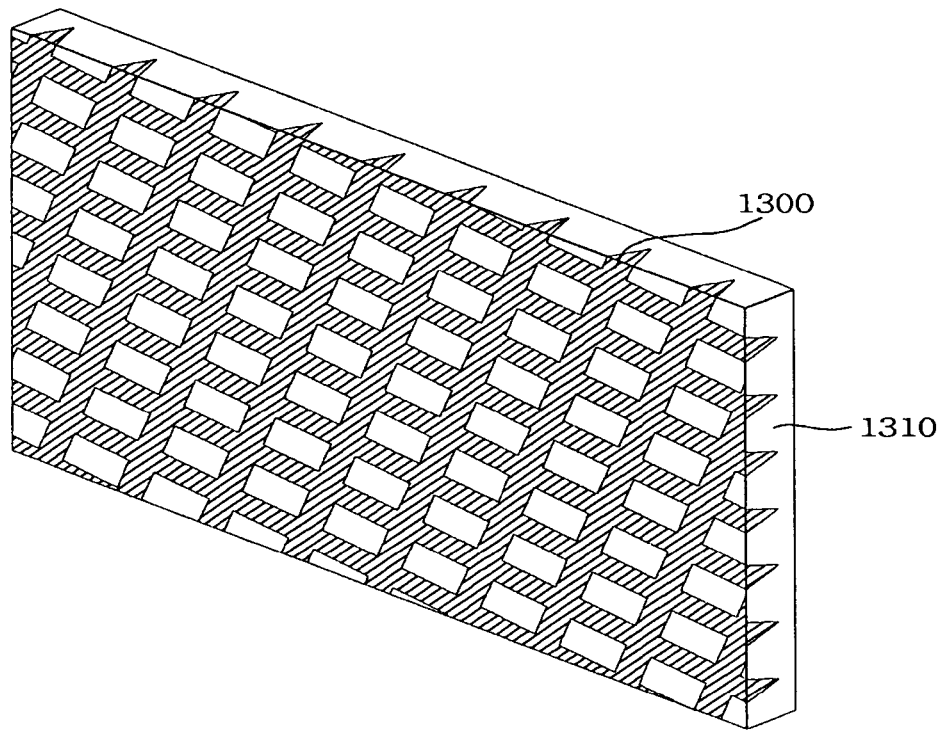
Figure 14B:
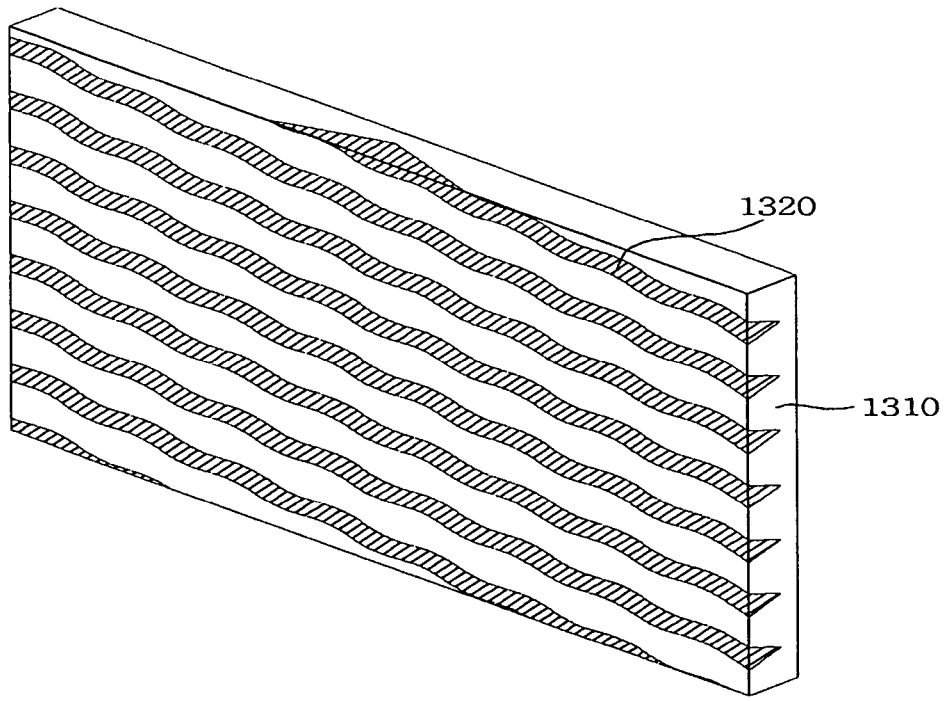
Figure 14C:
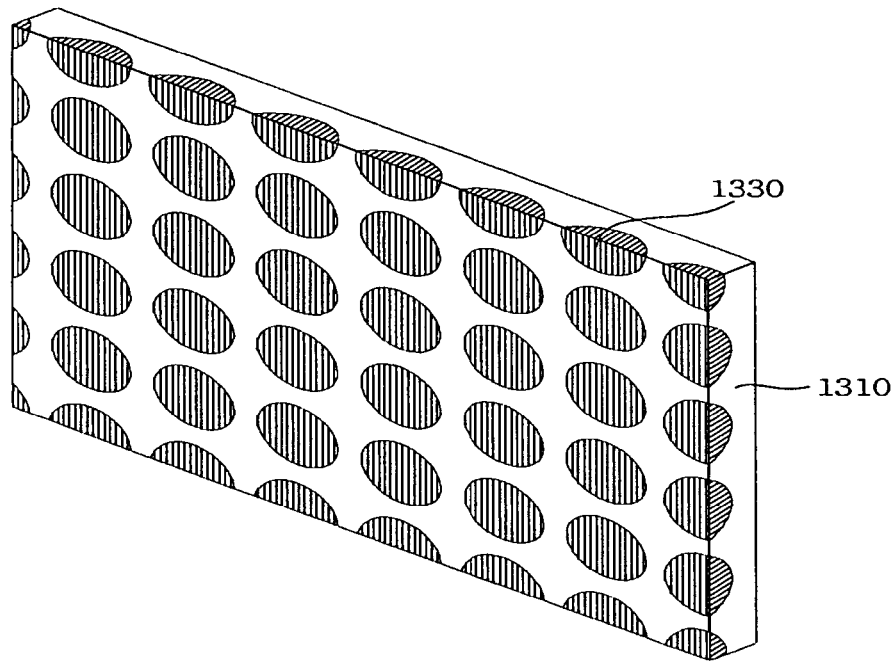

FIGS. 14a to 14c illustrate various types of pattern portions.

Referring to FIG. 14a, a pattern portion 1300 is formed in a matrix type.

Referring to FIG. 14b, a pattern portion 1320 is formed in a wave type.

Referring to FIG. 14c, a pattern portion 1330 is formed in a protrusion type. For example, the plurality of the pattern portions 1330 of a protrusion type having a hemisphere shape are spaced with a predetermined distance therebetween.

As described above, a type of the pattern portion may be variously changed.

Figure 15:
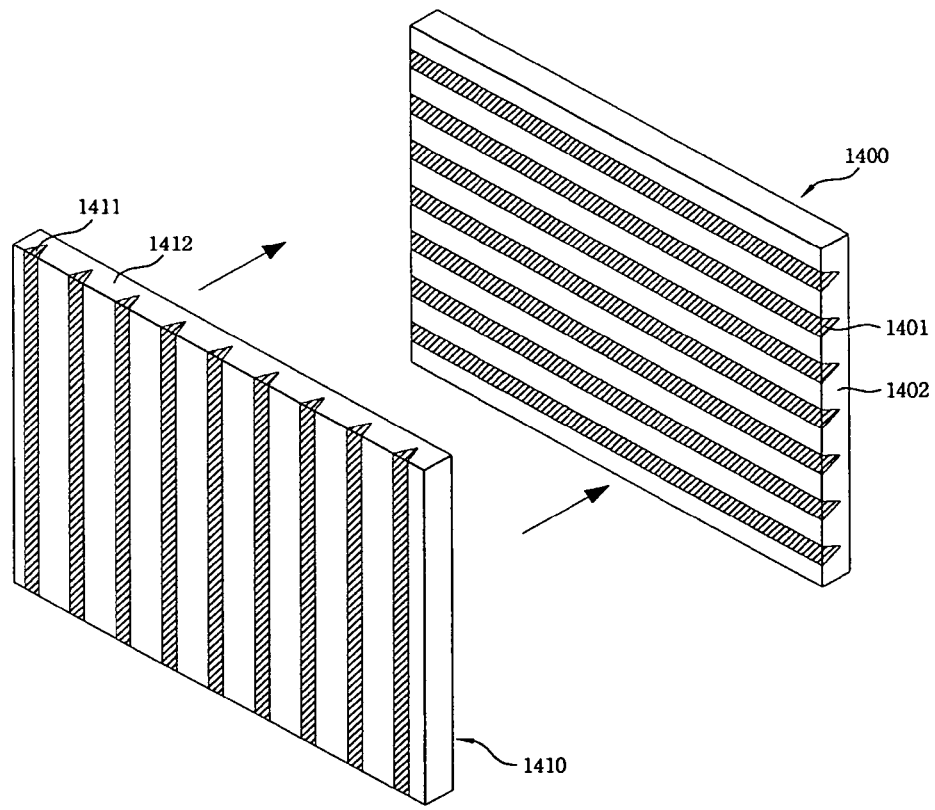

FIG. 15 illustrates one example of a case of using two or more pattern portions each having a different pattern.

Referring to FIG. 15, a first external light shielding layer 1400 and a second external light shielding layer 1410 may be included in one filter. The first external light shielding layer 1400 includes a first base portion 1402 and a first pattern portion 1401 parallel to a long side of the first base portion 1402. The second external light shielding layer 1410 includes a second base portion 1412 and a second pattern portion 1411 parallel to a short side of the second base portion 1412.

As above, when two or more pattern portions each having a different pattern are used together, a viewing angle of the plasma display panel is be variously controlled.

Figure 16:
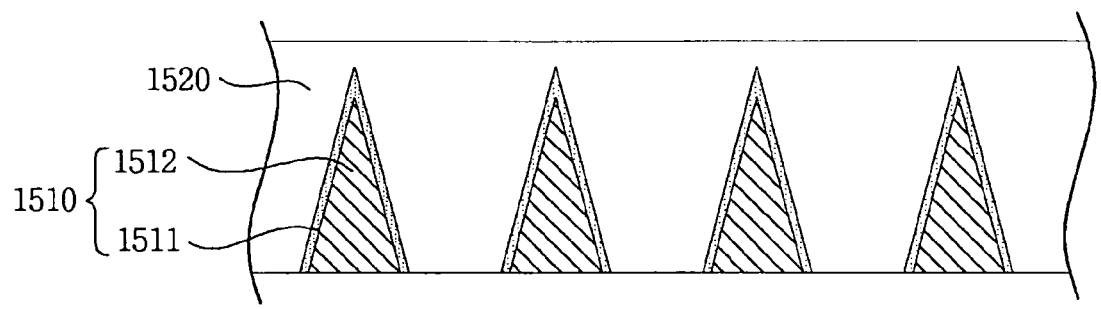

FIG. 16 illustrates another structure of a pattern portion.

Referring to FIG. 16, a pattern portion 1510 has a plurality of layers. For example, the pattern portion 1510 includes an upper pattern portion 1511 and a lower pattern portion 1512. The upper pattern portion 1511 covers the lower pattern portion 1512.

A refractive index of the upper pattern portion 1511 may be less than a refractive index of a base portion 1520. A color of the upper pattern portion 1511 may be darker than a color of the base portion 1520. A refractive index of the lower pattern portion 1512 may be different from or equal to the refractive index of the upper pattern portion 1511. For example, the refractive index of the lower pattern portion 1512 is less than the refractive index of the upper pattern portion 1511.

The plasma display panel of the above-described plasma display apparatus according to one embodiment contains lead (Pb) equal to or less than 1,000 PPM (parts per million).

In other words, since the Pb content based on total weight for all components of the plasma display panel is equal to or less than 1,000 PPM, the total Pb content in the plasma display panel is equal to or less than 1,000 PPM.

Further, a Pb content in a specific component of the plasma display panel may be equal to or less than 1,000 PPM. For example, a Pb content in at least one of the barrier rib or the dielectric layer may be equal to or less than 1,000 PPM.

A sum of a Pb content in each component of the plasma display panel may be equal to or less than 1,000 PPM. In other words, a sum of a Pb content in each of the barrier rib, the dielectric layer, the electrode, the phosphor layer, and the like, may be equal to or less than 1,000 PPM.

Sine the total Pb content in the plasma display panel is equal to or less than 1,000 PPM, Pb contained in the plasma display panel does not adversely affect to the human body.

Figure 17:
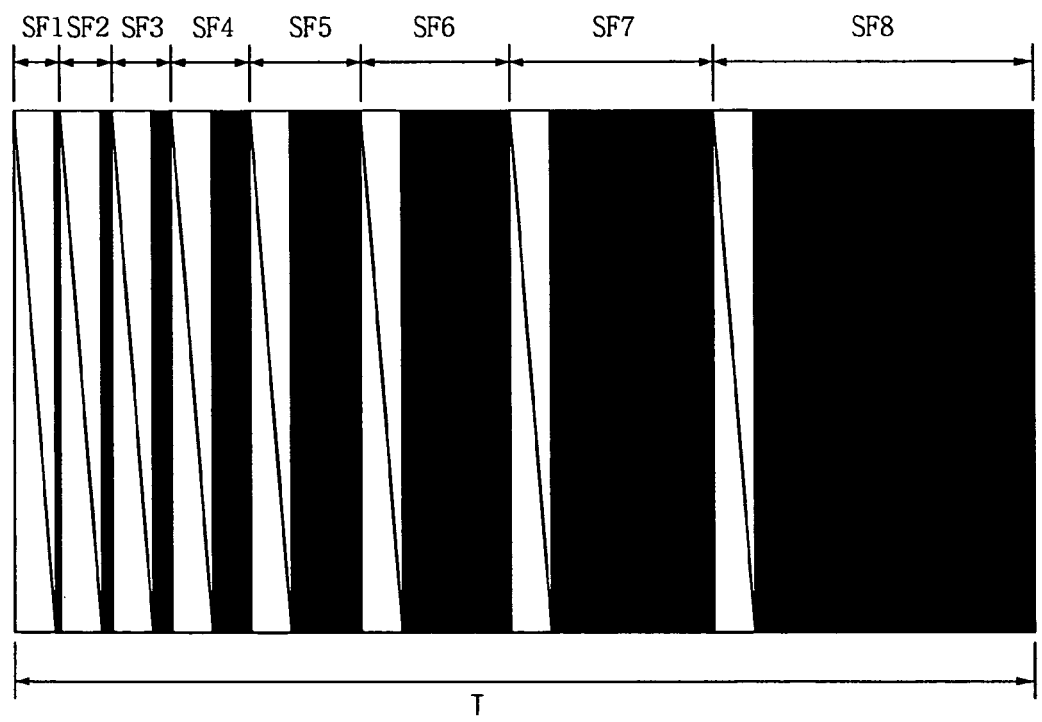
Figure 17:
Figure 17:

FIG. 17 illustrates a frame for achieving a gray level of an image displayed by the plasma display apparatus according to one embodiment.

Figure 18:
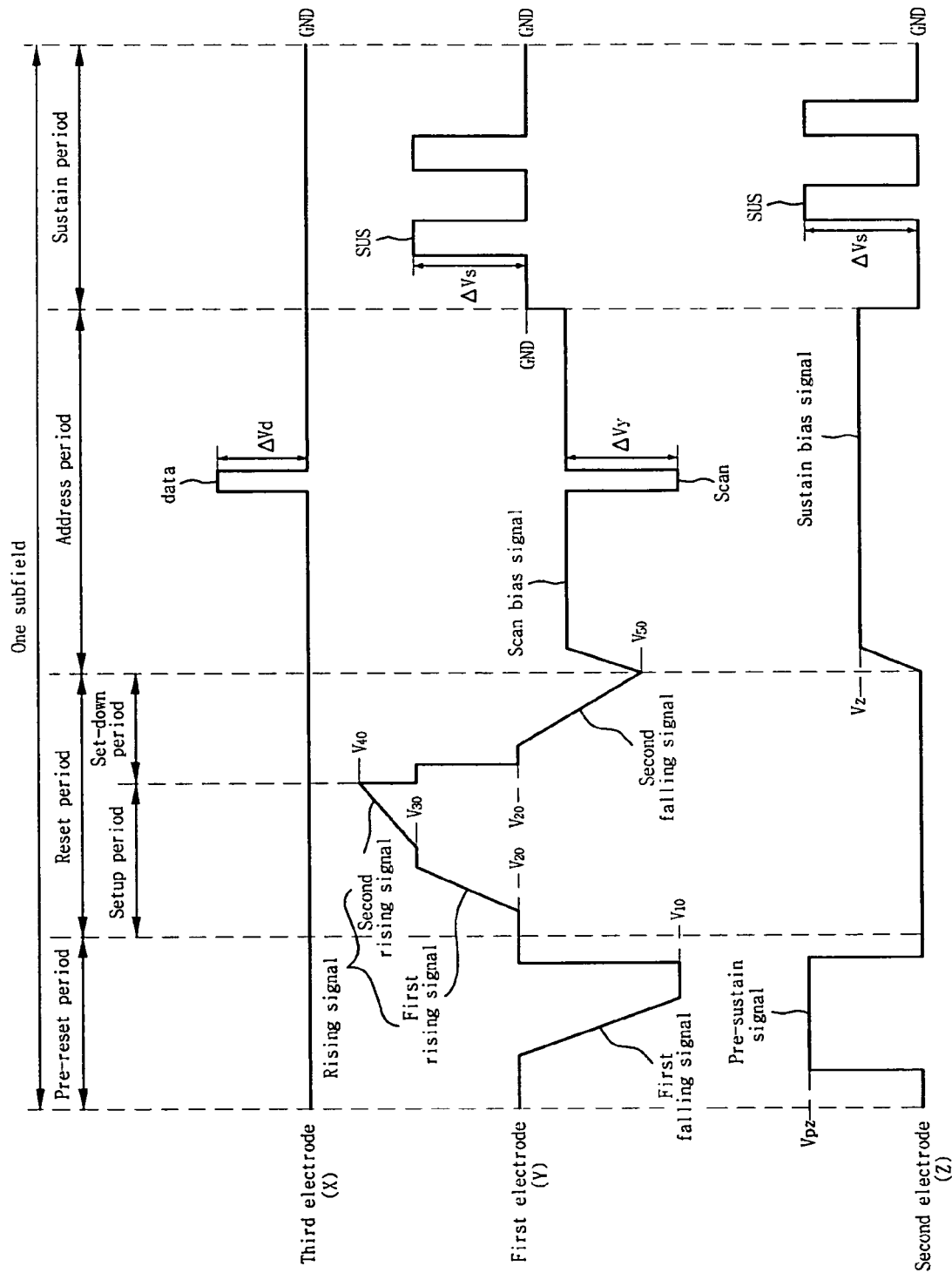

FIG. 18 illustrates one example of an operation of the plasma display apparatus according to one embodiment.

Referring to FIG. 17, a frame for achieving a gray level of an image displayed by the plasma display apparatus according to one embodiment is divided into several subfields each having a different number of emission times.

Each subfield is subdivided into a reset period for initializing all the cells, an address period for selecting cells to be discharged, and a sustain period for representing gray level in accordance with the number of discharges.

For example, if an image with 256-level gray level is to be displayed, a frame, as illustrated in FIG. 17, is divided into 8 subfields SF1 to SF8. Each of the 8 subfields SF1 to SF8 is subdivided into a reset period, an address period, and a sustain period.

The number of sustain signals supplied during the sustain period determines gray level weight in each of the subfields. For example, in such a method of setting gray level weight of a first subfield to $2^0$ and gray level weight of a second subfield to $2^1$, the sustain period increases in a ratio of $2^n$ (where, n=0, 1, 2, 3, 4, 5, 6, 7) in each of the subfields. Since the sustain period varies from one subfield to the next subfield, a specific gray level is achieved by controlling the sustain period which are to be used for discharging each of the selected cells, i.e., the number of sustain discharges that are realized in each of the discharge cells.

The plasma display apparatus according to one embodiment uses a plurality of frames to display an image during 1 second. For example, 60 frames are used to display an image during 1 second. In this case, a duration T of time of one frame may be 1/60 seconds, i.e., 16.67 ms.

Although FIG. 17 has illustrated and described a case where one frame includes 8 subfields, the number of subfields constituting one frame may vary. For example, one frame may include 12 subfields or 10 subfields.

Further, although FIG. 17 has illustrated and described the subfields arranged in increasing order of gray level weight, the subfields may be arranged in decreasing order of gray level weight, or the subfields may be arranged regardless of gray level weight.

FIG. 18 illustrates one example of an operation of the plasma display apparatus according to one embodiment in one subfield of a plurality of subfields of one frame as illustrated in FIG. 17.

During a pre-reset period prior to a reset period, a first falling signal is supplied to a first electrode Y.

During the supplying of the first falling signal to the first electrode Y, a pre-sustain signal of a polarity direction opposite a polarity direction of the first falling signal is supplied to a second electrode Z.

The first falling signal supplied to the first electrode Y gradually falls from a ground level voltage GND to a tenth voltage V10.

The pre-sustain signal is constantly maintained at a pre-sustain voltage Vpz. The pre-sustain voltage Vpz is substantially equal to a voltage (i.e., a sustain voltage Vs) of a sustain signal (SUS) which will be supplied during a sustain period.

As above, during the pre-reset period, the first falling signal is supplied to the first electrode Y and the pre-sustain signal is supplied to the second electrode Z. As a result, wall charges of a predetermined polarity are accumulated on the first electrode Y, and wall charges of a polarity opposite the polarity of the wall charges accumulated on the first electrode Y are accumulated on the second electrode Z. For example, wall charges of a positive polarity are accumulated on the first electrode Y, and wall charges of a negative polarity are accumulated on the second electrode Z.

As a result, a setup discharge with a sufficient strength occurs during the reset period such that the initialization of all the discharge cells is performed stably.

Even if the amount of wall charges accumulated inside the discharge cell is not sufficient, a setup discharge with a sufficient strength occurs.

Furthermore, although a voltage of a rising signal supplied to the first electrode Y during the reset period is low, a setup discharge with a sufficient strength occurs.

A subfield, which is first arranged in time order in a plurality of subfields of one frame, may include a pre-reset period prior to a reset period so as to obtain sufficient driving time. Or, two or three subfields may include a pre-reset period prior to a reset period.

All the subfields may not include the pre-reset period.

The reset period is further divided into a setup period and a set-down period. During the setup period, the rising signal of a polarity direction opposite a polarity direction of the first falling signal is supplied to the first electrode Y.

The rising signal includes a first rising signal and a second rising signal. The first rising signal gradually rises from a twentieth voltage V20 to a thirtieth voltage V30 with a first slope, and the second rising signal gradually rises from the thirtieth voltage V30 to a fortieth voltage V40 with a second slope.

The rising signal generates a weak dark discharge (i.e., a setup discharge) inside the discharge cell during the setup period, thereby accumulating a proper amount of wall charges inside the discharge cell.

The second slope of the second rising signal is gentler than the first slope of the first rising signal. When the second slope is gentler than the first slope, the voltage of the rising signal rises relatively rapidly until the setup discharge occurs, and the voltage of the rising signal rises relatively slowly during the generation of the setup discharge. As a result, the quantity of light generated by the setup discharge is reduced. Accordingly, contrast of the plasma display apparatus is improved.

During the set-down period, a second falling signal of a polarity direction opposite a polarity direction of the rising signal is supplied to the first electrode Y. The second falling signal gradually falls from the twentieth voltage V20 to a fiftieth voltage V50. The second falling signal generates a weak erase discharge (i.e., a set-down discharge) inside the discharge cell. Furthermore, the remaining wall charges are uniform inside the discharge cells to the extent that an address discharge can be stably performed.

Figure 19A:
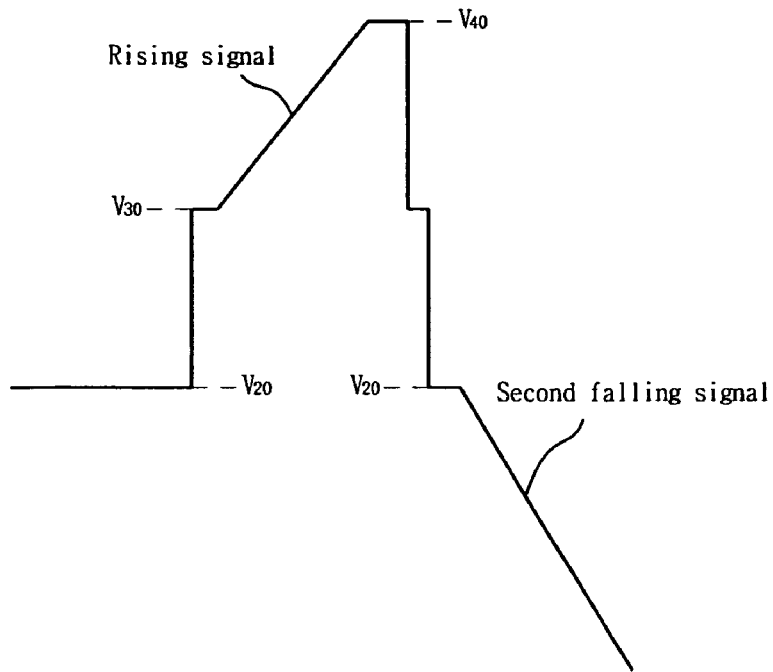
Figure 19B:
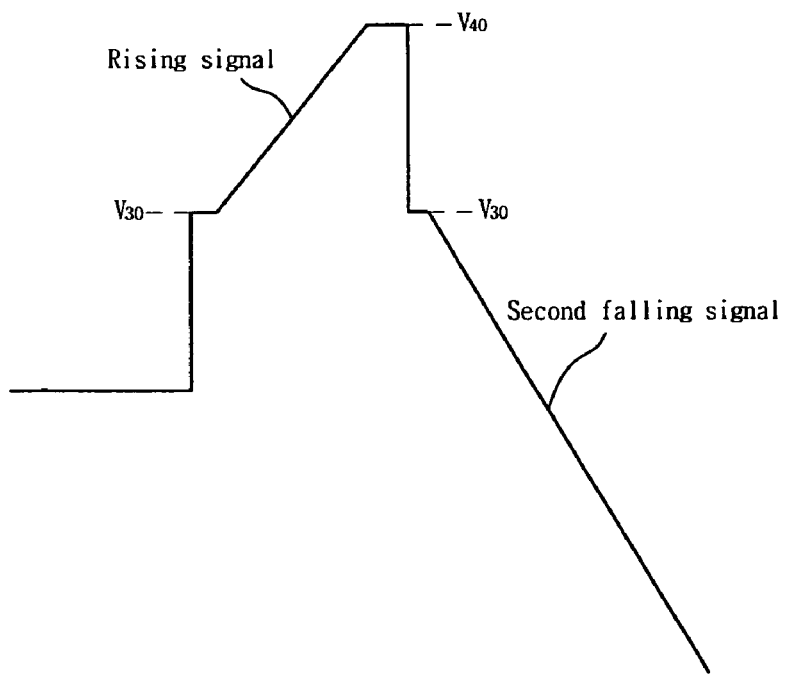

The following is a detailed description of another form of a rising signal and a second falling signal, with reference to FIGS. 19a and 19b.

FIGS. 19a and 19b illustrate another form of a rising signal and a second falling signal.

Referring to FIG. 19a, the rising signal sharply rises to the thirtieth voltage V30, and then gradually rises from the thirtieth voltage V30 to the fortieth voltage V40.

The rising signal illustrated in FIG. 18 may gradually rise with the two different slopes through two stages. However, the rising signal illustrated in FIG. 19a may gradually rise through one stage. As above, the rising signal may vary in the various forms.

Referring to FIG. 19b, the second falling signal gradually falls from the thirtieth voltage V30. As above, a voltage falling time point of the second falling signal is changeable. In other words, the second falling signal may vary in the various forms.

Referring again to FIG. 18, during the address period, a scan bias signal, which is maintained at a voltage higher than the fiftieth voltage V50 of the second falling signal, is supplied to the first electrode Y.

A scan signal (Scan), which falls from the scan bias signal by a scan voltage magnitude ΔVy, is supplied to all the first electrodes Y1 to Yn.

For example, a first scan signal (Scan 1) is supplied to the first electrode Y1, and then a second scan signal (Scan 2) is supplied to the first electrode Y2. Therefore, an n-th scan signal (Scan n) is supplied to the first electrode Yn.

The width of the scan signal may vary from one subfield to the next subfield. In other words, the width of a scan signal in at least one subfield may be different from the width of a scan signal in the other subfields. For example, the width of a scan signal in a subfield may be more than the width of a scan signal in the next subfield in time order. Further, the width of the scan signal may be gradually reduced in the order of 2.6 µs, 2.3 µs, 2.1 µs, 1.9 µs, etc., or in the order of 2.6 µs, 2.3 µs, 2.3 µs, 2.1 µs, 1.9 µs, 1.9 µs, etc.

As above, when the scan signal (Scan) is supplied to the first electrode Y, a data signal (data) corresponding to the scan signal (Scan) is supplied to the third electrode X. The data signal (data) rises from a ground level voltage GND by a data voltage magnitude ΔVd.

As the voltage difference between the scan signal (Scan) and the data signal (data) is added to the wall voltage generated during the reset period, the address discharge is generated within the discharge cell to which the data signal (data) is supplied.

A sustain bias signal is supplied to the second electrode Z during the address period to prevent the generation of the unstable address discharge by interference of the second electrode Z. The sustain bias signal is substantially maintained at a sustain bias voltage Vz. The sustain bias voltage Vz is lower than the voltage Vs of the sustain signal and is higher than the ground level voltage GND.

During the sustain period, a sustain signal (SUS) is alternately supplied to the first electrode Y and the second electrode Z. The sustain signal (SUS) has a voltage magnitude corresponding to the sustain voltage Vs.

As the wall voltage within the discharge cell selected by performing the address discharge is added to the sustain voltage Vs of the sustain signal (SUS), every time the sustain signal (SUS) is supplied, a sustain discharge, i.e., a display discharge occurs between the first electrode Y and the second electrode Z.

Figure 20:
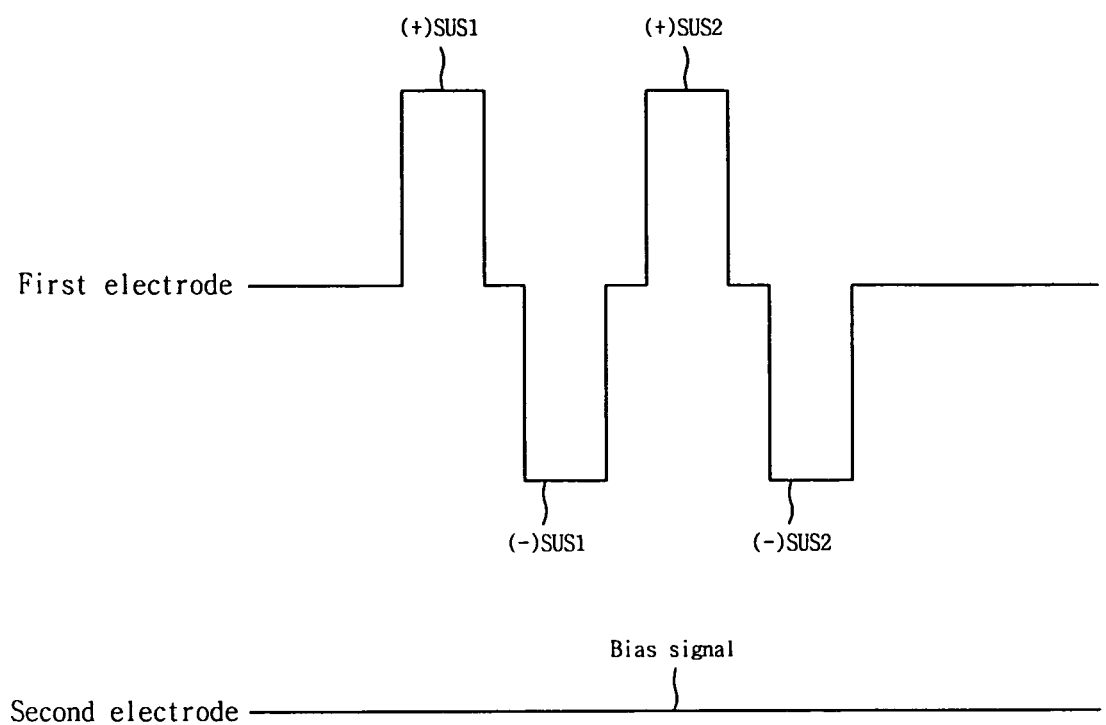

FIG. 20 illustrates another type of a sustain signal.

Referring to FIG. 20, a sustain signal ((+)SUS1, (+)SUS2) of a positive polarity direction and a sustain signal ((−)SUS1, (−)SUS2) of a negative polarity direction are alternately supplied to the first electrode Y or the second electrode Z, for example, to the first electrode Y in FIG. 20.

As above, when the sustain signal of the positive polarity direction and the sustain signal of the negative polarity direction are alternately supplied to the first electrode Y, a bias signal is supplied to the second electrode Z. The bias signal is constantly maintained at the ground level voltage GND.

As illustrated in FIG. 20, when the sustain signal is supplied to either the first electrode Y or the second electrode Z, a single diving board for installing a circuit for supplying the sustain signal to either the first electrode Y or the second electrode Z is required. Accordingly, the whole size of a driver included in the plasma display apparatus is reduced such that the manufacturing cost is reduced.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A plasma display apparatus comprising:
a plasma display panel, on which an image is displayed, the plasma display panel including:
a front substrate on which a first electrode and a second electrode are formed in parallel to each other,
a rear substrate on which a third electrode is formed to intersect the first electrode and the second electrode, wherein the front substrate and the rear substrate are coalesced in a chamber into which a discharge gas is injected so as to omit an exhaust unit in the rear substrate, and
a barrier rib, formed between the front and rear substrates, partitioning a discharge cell, wherein the discharge cell is filled with a discharge gas containing xenon (Xe) equal to or more than 10% based on total weight of the discharge gas; and
a filter, positioned in front of the plasma display panel, including a near infrared ray shielding layer that absorbs or reflects near infrared rays.

2. The plasma display apparatus of claim 1, wherein a seal layer coalescing the front substrate and the rear substrate is formed between the front substrate and rear substrate, and the seal layer includes a photo-crosslinked material.

3. The plasma display apparatus of claim 1, wherein a Xe content in the discharge gas ranges from 13% to 30% based on total weight of the discharge gas.

4. The plasma display apparatus of claim 1, wherein the filter is spaced from the plasma display panel by a predetermined distance.

5. The plasma display apparatus of claim 1, wherein the filter is adhered to a front surface of the plasma display panel.

6. The plasma display apparatus of claim 1, wherein an exhaust unit is omitted in the front substrate.

7. The plasma display apparatus of claim 1, wherein the exhaust unit includes at least one of an exhaust hole, an exhaust tip, and an exhaust pipe.

8. The plasma display apparatus of claim 1, wherein the near infrared ray shielding layer includes a plurality of layers having different refraction indexes that are stacked one another.

9. The plasma display apparatus of claim 1, wherein the near infrared ray shielding layer includes a resin material including dyes of an organic compound.

10. The plasma display apparatus of claim 1, wherein the filter includes a base portion and a pattern portion formed on the base portion, and a color of the pattern portion is darker than a color of the base portion.

11. The plasma display apparatus of claim 10, wherein a traveling direction of the pattern portion and a long side of the base portion form a predetermined angle, and the predetermined angle ranges from 0.5° to 9°.

12. The plasma display apparatus of claim 10, wherein a refraction index of the pattern portion is less than a refraction index of the base portion.

13. The plasma display apparatus of claim 12, wherein the refractive index of the pattern portion ranges from 0.8 to 0.999 times the refractive index of the base portion.

14. The plasma display apparatus of claim 10, wherein an upper area of the pattern portion is farther from the plasma display panel than a bottom area of the pattern portion, and an upper width of the pattern portion in the upper area is less than a lower width of the pattern portion in the bottom area.

15. The plasma display apparatus of claim 10, wherein the height of the base portion ranges from 1.01 to 2.25 times the height of the pattern portion.

16. The plasma display apparatus of claim 10, wherein the shortest gap between the pattern portions ranges from 1.1 to 5 times a lower width of the pattern portion.

17. The plasma display apparatus of claim 10, wherein the longest gap between the pattern portions ranges from 1.1 to 3.25 times the shortest gap between the pattern portions.

18. The plasma display apparatus of claim 10, wherein the height of the pattern portion ranges from 0.89 to 4.25 times the shortest gap between the pattern portions.

19. A plasma display apparatus comprising:
a plasma display panel, on which an image is displayed, the plasma display panel including:
a front substrate on which a first electrode and a second electrode are formed in parallel to each other,
a rear substrate on which a third electrode is formed to intersect the first electrode and the second electrode, wherein the front substrate and the rear substrate are coalesced in a chamber into which a discharge gas is injected so as to omit an exhaust unit in the rear substrate, and
a barrier rib, formed between the front and rear substrates, partitioning a discharge cell, wherein the discharge cell is filled with a discharge gas containing xenon (Xe) equal to or more than 10% based on total weight of the discharge gas; and
a filter, positioned in front of the plasma display panel, including a near infrared ray shielding layer that absorbs or reflects near infrared rays, wherein an adhesive layer for adhering the plasma play panel and the filter is formed between the plasma play panel and the filter, and the thickness of the adhesive layer ranges from 10 μm to 50 μm.

20. The plasma display apparatus of claim 19, wherein thickness of the adhesive layer ranges from 20 μm to 40 μm.

* * * * *